United States Patent

Hirano et al.

[11] Patent Number: 6,120,661
[45] Date of Patent: Sep. 19, 2000

[54] APPARATUS FOR PROCESSING GLASS SUBSTRATE

[75] Inventors: Shinsuke Hirano, Kanagawa; Kei Takatsu, Tokyo; Shingo Kadomura, Kanagawa, all of Japan

[73] Assignee: Sony Corporation, Tokyo, Japan

[21] Appl. No.: 09/327,224

[22] Filed: Jun. 7, 1999

[30] Foreign Application Priority Data

Jun. 8, 1998 [JP] Japan ................... 10-159607

[51] Int. Cl.[7] .................. C23C 14/34; C23C 16/458; C23F 1/02; H01L 21/203; H01L 21/302

[52] U.S. Cl. .................. 204/298.15; 204/298.01; 204/298.02; 204/298.09; 204/298.31; 118/723 R; 118/728; 361/234; 156/345; 134/105; 134/166 R; 134/171; 134/201; 134/137

[58] Field of Search .................. 204/298.01, 298.02, 204/298.15, 298.09, 239.31; 118/723 R, 728; 361/234; 156/345; 134/105, 166 R, 171, 201, 137

[56] References Cited

U.S. PATENT DOCUMENTS 5,909,354  6/1999  Harada et al. .................. 361/234
5,981,913  11/1999  Kadomura et al. .................. 219/444.1

FOREIGN PATENT DOCUMENTS 10-32239    2/1998  Japan .
11-121598   4/1999  Japan .
11-138251   5/1999  Japan .

*Primary Examiner*—Alan Diamond
*Attorney, Agent, or Firm*—Ronald P. Kananen; Rader, Fishman & Grauer

[57] ABSTRACT

A glass substrate processing apparatus, part of which comprises a composite material, the composite material being formed of a matrix and a ceramic layer formed on a surface of the matrix by a thermal spraying method, the matrix being formed of a ceramic member and an aluminum-containing material filled in a texture of the ceramic member.

12 Claims, 14 Drawing Sheets

APPARATUS FOR PROCESSING GLASS SUBSTRATE

BACKGROUND OF THE INVENTION AND RELATED ART STATEMENT

The present invention relates to an apparatus for processing a glass substrate or a thin film formed on a glass substrate by etching, CVD or sputtering.

In production of liquid crystal displays, glass substrates are widely used, and the glass substrates for liquid crystal displays are irresistibly increasing in terms of mass-productivity and a cost reduction. Further, various circuits formed on a glass substrate are becoming finer and higher in an integration degree. A dry etching technique and chemical vapor deposition (CVD) and physical vapor deposition (PVD) methods as thin film forming methods, for realizing fine processing in production of liquid crystal displays, are also required to have far higher accuracy, and there have been proposed processes which are devised and refined with regard to gas chemistry, a plasma source, glass substrate temperature control or the like.

The production of the liquid crystal display includes various processes for treating various thin films formed on the glass substrate, such as an insulating film, a semiconductor film, an electrically conductive film, etc., by etching, CVD processing, sputtering and the like. Those various thin films formed on the glass substrate will be sometimes generically referred to as "base material". There is a growing recognition that in the above treatment processes, controlling, setting and managing the temperature of the base material are essential for improving the accuracy of processing the base material and the accuracy of treatment of the base material.

In etching treatment and CVD treatment, plasma treatment is carried out in many cases. In plasma treatment at a high temperature, heat is abundantly transmitted from plasma into the base material due to ion impact on the basic material in the etching treatment and due to irradiation of high-density plasma to the base material in the CVD treatment. As a result, in many cases, the base material is temperature-increased by approximately 40° C. to 100° C. or more as compared with a temperature of the base material has before the generation of plasma. In a process of heating the base material with a glass substrate supporting stage for supporting a glass substrate and carrying out the plasma treatment at a high temperature, therefore, the technique of preventing the influence of heat transmission from plasma to the base material and controlling the base material at a predetermined temperature with high accuracy are essential.

However, temperature control at high temperatures according to prior arts cannot be said to be satisfactory. In a conventional technique, it is naturally expected that the base material is temperature-increased to the above-described extent during the process treatment, and the glass substrate supporting stage is set at a lower temperature by taking the above temperature increase of the base material into account. And, since the process is proceeded with taking the temperature increase of the base material into account, many problems remain to be solved, that is, the process takes a longer time, a throughput is decreased and the reproducibility and controllability of the process decrease due to a large change in temperature.

As one means for overcoming the above problems, a method is conceivable in which a glass substrate is fixed to the glass substrate supporting stage by means of a mechanical clamp device. However, when the mechanical clamp device is used, an in-plane temperature of the glass substrate is non-uniform or it is difficult to suppress the influence of heat transmission from plasma into the base material since the contact between the glass substrate supporting stage and the glass substrate is poor, which consequently causes a problem that the properties and the thickness of the base material formed on the glass substrate fluctuate depending upon positions of the base material on the glass substrate or that the properties of the base material fluctuate in the thickness direction of the base material. Further, when the base material formed on the glass substrate is etched, there is caused another problem that the form of the etched base material fluctuates depending upon positions of the base material on the glass substrate.

As another means for overcoming the above problems, it is conceivable to mount an electrostatic chuck on the glass substrate supporting stage. For mounting the electrostatic chuck on the glass substrate supporting stage, how to junction the heated glass substrate supporting stage and a dielectric material constituting the electrostatic chuck is a big problem which remains to be solved. This problem prevents the practical use of the glass substrate supporting stage on which the electrostatic chuck is mounted. That is, the glass substrate supporting stage designed for heating the substrate at high temperatures is required to effectively transmit heat to the base material when the base material is fixed onto the glass substrate supporting stage by adsorption with the electrostatic chuck. The glass substrate supporting stage and the electrostatic chuck are required to be junctioned to each other in a good thermal conduction state.

Meanwhile, aluminum (Al) is used as a material for the glass substrate supporting stage of a glass substrate processing apparatus such as an etching apparatus, a CVD apparatus and a sputtering apparatus, from the viewpoints of its high thermal conductivity and an easiness in processing thereof. Aluminum has a linear thermal expansion coefficient of approximately $23\times10^{-6}$/K. Generally, a ceramic material is used as a dielectric material for the electrostatic chuck. When the glass substrate supporting stage and the electrostatic chuck are directly junctioned to each other, therefore, the following problem is caused. Due to a linear thermal expansion coefficient difference between a ceramic material constituting the electrostatic chuck and aluminum constituting the glass substrate supporting stage, the ceramic material is damaged, i.e., broken by heating and cooling the glass substrate supporting stage, which results in the destruction of the electrostatic chuck.

For this reason, it is general practice at present to fix the electrostatic chuck to the glass substrate supporting stage by screws or the like. In the above structure, however, the junction interface between the electrostatic chuck and the glass substrate supporting stage is heat-insulated under vacuum when the pressure in the glass substrate processing apparatus is decreased, so that the efficiency of heat exchange between the glass substrate supporting stage and the base material through the electrostatic chuck is downgraded. As a result, the base material suffers heat from plasma and is temperature-increased to a level higher than a predetermined temperature. When a base material is formed on a glass substrate, there is therefore caused a problem that the properties and the thickness of the base material formed on the glass substrate fluctuate depending upon positions of the base material on the glass substrate, or that the properties of the base material fluctuate in the thickness direction of the base material. When the base material formed on the glass substrate is etched, there is also caused a problem that the form of the etched base material fluctuates depending upon positions of the base material on the glass substrate.

When the conventional supporting stage having the electrostatic chuck constituted of a dielectric member is heated up to a high temperature, the dielectric member undergoes cracking due to a linear thermal expansion coefficient difference between the supporting stage and the dielectric member, and the electrostatic chuck does not function as such any longer. For example, JP-A-10-32239 discloses means for overcoming the above problem, or discloses a supporting stage having an electrostatic chuck which is manufactured by junctioning a ceramic sintered plate for the electrostatic chuck and a ceramic/aluminum composite plate. The ceramic sintered plate for the electrostatic chuck and the composite plate are junctioned to each other by soldering or brazing. When the above supporting stage is used, plasma etching with excellent temperature control at a high temperature can be carried out. However, when a glass substrate having a large area of 0.6 m×0.7 m, or a glass substrate having a large area of 1 m×1 m to be used in the future, is processed, it is very difficult to manufacture a large-area composite plate composed of ceramic and aluminum.

OBJECT AND SUMMARY OF THE INVENTION

It is an object of the present invention to provide a glass substrate processing apparatus which can avoid the occurrence of damage caused by a thermal expansion coefficient difference between materials constituting the glass substrate processing apparatus, which is feasible for use at high temperatures, which permits the processing of a glass substrate having a large area and which permits the processing, for example, of a base material formed on a glass substrate at high temperatures.

The glass substrate processing apparatus of the present invention for achieving the above object is a glass substrate processing apparatus, part of which comprises a composite material, the composite material being formed of a matrix and a ceramic layer, the matrix being formed of a ceramic member and an aluminum-containing material filled in a texture of the ceramic member, and the ceramic layer being formed on a surface of the matrix by a thermal spraying method. "Processing a glass substrate" as used in the present specification refers not only to a case where a glass substrate itself is processed but also to a case where a base material formed on a glass substrate is processed. Further, "processing" includes etching treatment, CVD treatment and sputtering.

The glass substrate processing apparatus of the present invention may be an embodiment which is for carrying out etching treatment, CVD treatment or sputtering on a base material formed on a glass substrate and in which the part of the glass substrate processing apparatus comprising the composite material constitutes a glass substrate supporting stage having an electrostatic chuck function and having temperature controlling means. The invention includes an embodiment in which the glass substrate supporting stage is used as an electrode and the ceramic layer has an electrostatic chuck function (single-polar system) or an embodiment in which an electrode is formed within the ceramic layer and the ceramic layer has an electrostatic chuck function (bipolar system).

When the part of the glass substrate processing apparatus constitutes the glass substrate supporting stage, the temperature controlling means may be a heater. In this case, the heater may be disposed outside the composite material, or it may be disposed within the matrix. In the latter case, when the matrix has a linear thermal expansion coefficient $\alpha_1$ [unit: $10^{-6}$/K], preferably, a linear thermal expansion coefficient $\alpha_H$ [unit: $10^{-6}$/K] of a material constituting the heater satisfies $(\alpha_1-4) \leq \alpha_H \leq (\alpha_1+4)$. The above material constituting the heater refers to a material constituting a portion (for example, sheath tube) which is in contact with the matrix. The "material constituting the heater" as used herein will be used in this sense hereinafter. Otherwise, the temperature controlling means may be a piping disposed within the matrix for flowing a temperature-controlling heating medium therein, and when the matrix has a linear thermal expansion coefficient $\alpha_1$ [unit: $10^{-6}$/K], preferably, a linear thermal expansion coefficient $\alpha_1$ [unit: $10^{-6}$/K] of the piping satisfies $(\alpha_1-4) \leq \alpha_P \leq (\alpha_1+4)$. Generally, a linear thermal expansion coefficient of a substance is expressed by $\alpha=(dL/d\theta)/L_0$ in which L is a length of the substance, $L_0$ is a length of the substance at 0° C. and $\theta$ is a temperature, and the unit thereof is $K^{-1}$(1/K), while the present specification uses $10^{-6}$/K as a unit for a linear thermal expansion coefficient. Linear thermal expansion coefficient data will be sometimes explained without the unit hereinafter.

When the linear thermal expansion coefficient $\alpha_1$ of the matrix and the linear thermal expansion coefficient $\alpha_H$ or $\alpha_P$ of the material constituting the heater or the piping satisfy the above relationships, the damage on the ceramic layer can be effectively prevented.

In the glass substrate processing apparatus of the present invention, when the matrix has a linear thermal expansion coefficient $\alpha_1$ [unit: $10^{-6}$/K], preferably, a linear thermal expansion coefficient $\alpha_2$ [unit: $10^{-6}$/K] of the ceramic layer satisfies $(\alpha_1-4) \leq \alpha_2 \leq (\alpha_1+4)$. In this case, when the glass substrate processing apparatus is used at a high temperature, for example, at approximately 300° C., the damage of the ceramic layer which is to be caused by a difference between the linear thermal expansion coefficient $\alpha_1$ of the matrix and the linear thermal expansion coefficient $\alpha_2$ of the ceramic layer can be reliably prevented.

The above matrix can be produced, for example, by a step (A) of filling an aluminum-containing material in a texture of a ceramic member to manufacture the matrix in which the aluminum-containing material is filled in the texture of the ceramic member and a step (B) of forming a ceramic layer on the surface of the matrix by a thermal spraying method. In the embodiment in which an electrode is formed within the ceramic layer (bipolar system), the above step (B) preferably comprises the steps of forming a first ceramic layer on the surface of the matrix by a thermal spraying method, forming an electrode on the first ceramic layer by a thermal spraying method, a brazing method or a plating method, and then forming a second ceramic layer by a thermal spraying method to cover the entire surface.

In the above case, cordierite ceramic can be used for the ceramic member to form the matrix, aluminum (Al) and silicon (Si) can be used as for the aluminum-containing material to form the matrix, and $Al_2O_3$ can be used as a material for forming the ceramic layer. The material for forming the ceramic layer may contain, for example, $TiO_2$ for adjusting the linear thermal expansion coefficient and electric characteristics of the ceramic layer. Preferably, the volume ratio of the cordierite ceramic and the aluminum-containing material is determined so as to satisfy the relationship of $(\alpha_1-4) \leq \alpha_2 \leq (\alpha_1+4)$. Otherwise, desirably, the cordierite ceramic/aluminum-containing material volume ratio is 25/75 to 75/25, preferably 25/75 to 50/50. When the cordierite ceramic/aluminum-containing material volume ratio is within the above range, not only can the linear thermal expansion coefficient of the matrix be controlled, but also the matrix comes to show an electric conductivity value and a thermal conductivity value which are closer to those of a metal than to those of a pure ceramic. As a result, not only can a voltage be naturally applied to the matrix, but also a bias can be applied thereto. Further, the aluminum-containing material preferably contains silicon for satisfying $(\alpha_1-4) \leq \alpha_2 \leq (\alpha_1+4)$, and the content of silicon based on the aluminum-containing material is 12 to 35% by volume, preferably 16 to 35% by volume, more preferably 20 to 35% by volume. In actual embodiments, aluminum (Al) and silicon (Si) are filled in the texture of the ceramic member formed of cordierite ceramic, and silicon (Si) is not filled in aluminum (Al), while the above expression of "the aluminum-containing material contains silicon" is used for showing the volume ratio of aluminum (Al) and silicon (Si) of the aluminum-containing material. Expressions as used above will be also used in this sense hereinafter.

When cordierite ceramic is used for the ceramic member to form the matrix and when aluminum (Al) and silicon (Si) is used for the aluminum-containing material to form the matrix, the above step (A) preferably comprises the steps of placing the ceramic member composed of porous cordierite ceramic in a container, and casting a molten aluminum-containing material composed of aluminum and silicon into the container to fill the aluminum-containing material in the texture of the ceramic member by a high-pressure casting method. In this case, the ceramic member can be prepared by preforming cordierite ceramic, for example, by a die press forming method, a hydrostatic pressing method (CIP method or rubber pressing method), a casting method (also called a slip casting method) or a slurry pouring method and then sintering the preform composed of cordierite ceramic.

The ceramic member can be produced by preforming a cordierite ceramic powder and then sintering the powder, while it is preferred to produce the ceramic member by sintering a mixture of a cordierite ceramic powder with a cordierite ceramic fiber, in view of the formation of a porous ceramic member and the prevention of damage of the ceramic member during the manufacture of the matrix. In the latter case, the content of the cordierite ceramic fiber in the sintered ceramic member is 1 to 20% by volume, preferably 1 to 10% by volume, more preferably 1 to 5% by volume. The average particle diameter of the cordierite ceramic powder is 1 to 100 µm, preferably 5 to 50 µm, more preferably 5 to 10 µm. The average diameter of the cordierite ceramic fiber is 2 to 10 µm, preferably 3 to 5 µm, and the average length of the cordierite ceramic fiber is 0.1 to 10 mm, preferably 1 to 2 mm. Further, desirably, a mixture of the cordierite ceramic powder and the cordierite ceramic fiber is sintered at 800° C. to 1200° C., preferably at 800° C. to 1100° C. Desirably, the porosity of the ceramic member is 25 to 75%, preferably 50 to 75%.

Further, when the molten aluminum-containing material is cast into the container, desirably, the temperature of the ceramic member is 500° C. to 1000° C., preferably 700° C. to 800° C. and the temperature of the aluminum-containing material is 700° C. to 1000° C., preferably 750° C. to 900° C. When the aluminum-containing material is filled in the texture of the ceramic member by a high-pressure casting method, the absolute pressure to be applied is 200 to 1500 kgf/cm², preferably 800 to 1000 kgf/cm².

In another embodiment, aluminum nitride (AlN) may be used for the ceramic member to form the matrix, aluminum (Al) or aluminum (Al) and silicon (Si) may be used for the aluminum-containing material to form the matrix, and $Al_2O_3$ may be used as a material for forming the ceramic layer. The material for forming the ceramic layer may contain, for example, $TiO_2$ or $Y_xO_y$ for adjusting the linear thermal expansion coefficient and the electric characteristics of the ceramic layer. Preferably, the volume ratio of the aluminum nitride and the aluminum-containing material is determined so as to satisfy the relationship of $(\alpha_1-4) \leq \alpha_2 \leq (\alpha_1+4)$. Otherwise, desirably, the aluminum nitride/aluminum-containing material volume ratio is 40/60 to 80/20, preferably 60/40 to 70/30. When the aluminum nitride/aluminum-containing material volume ratio is within the above range, not can the linear thermal expansion coefficient of the matrix be controlled, but also the matrix comes to show an electric conductivity value and a thermal conductivity value which are closer to those of a metal than to those of a pure ceramic. As a result, not only can a voltage be naturally applied to the matrix, but also a bias can be applied thereto.

When aluminum nitride (AlN) is used for the ceramic member to form the matrix and aluminum (Al) is used for the aluminum-containing material to form the matrix, the above step (A) preferably comprises a step of infiltrating the aluminum-containing material of molten aluminum into the texture of the ceramic member composed of aluminum nitride particles in a non-pressurized state by a non-pressurized metal infiltration (immersion) method. The ceramic member can be prepared by preforming an aluminum nitride ceramic powder, for example, by a die press forming method, a hydrostatic pressing method, a casting method or a slurry pouring method and then sintering the preform composed of aluminum nitride at a temperature of 500° C. to 1000° C., preferably 800° C. to 1000° C. In this case, desirably, the average particle diameter of the aluminum nitride particles is 10 to 100 µm, preferably 10 to 50 µm, more preferably 10 to 20 µm.

In another embodiment, silicon carbide (SiC) may be used for the ceramic member to form the matrix, aluminum (Al) or aluminum (Al) and silicon (Si) may be used for the aluminum-containing material to form the matrix, and $Al_2O_3$ may be used as a material for forming the ceramic layer. The material for forming the ceramic layer may contain, for example, $TiO_2$ for adjusting the linear thermal expansion coefficient and the electric characteristics of the ceramic layer. Preferably, the volume ratio of silicon carbide and the aluminum-containing material is determined so as to satisfy the relationship of $(\alpha_1-4) \leq \alpha_2 \leq (\alpha_1+4)$. Otherwise, desirably, the silicon carbide/aluminum-containing material volume ratio is 40/60 to 80/20, preferably 60/40 to 70/30. When the silicon carbide/aluminum-containing material volume ratio is within the above range, not only can the linear thermal expansion coefficient of the matrix be controlled, but also the matrix comes to show an electric conductivity value and a thermal conductivity value which are closer to those of a metal than to those of a pure ceramic. As a result, not only can a voltage be naturally applied to the matrix, but also a bias can be applied thereto. When aluminum and silicon are used for aluminum-containing material to form the matrix, it is desirable for satisfying $(\alpha_1-4) \leq \alpha_2 \leq (\alpha_1+4)$ that the aluminum-containing material should contain 12 to 35% by volume, preferably 16 to 35% by volume, more preferably 20 to 35% by volume, of silicon.

In the above case, preferably, the step (A) comprises a step of infiltrating the aluminum-containing material of molten aluminum or molten aluminum and silicon into the texture of the ceramic member composed of silicon carbide particles in a non-pressurized state by a non-pressurized metal infiltration method. Otherwise, the step (A) preferably comprises the steps of placing the ceramic member composed of silicon carbide in a container and casting a aluminum-containing material of molten aluminum or molten aluminum and silicon into the container to fill the aluminum-containing material into the texture of the ceramic member by a high-pressure casting method. In this case, when the molten aluminum-containing material is flowed into the container, preferably, the temperature of the ceramic member is 500° C. to 1000° C. When the aluminum-containing material is filled in the texture of the ceramic member by a high-pressure casting method, preferably, the absolute pressure is 200 to 1500 kgf/cm². The ceramic member can be prepared, for example, by preforming a silicon carbide ceramic powder by a die press forming method, a hydrostatic pressing method, a casting method or a slurry pouring method and then sintering the preform composed of silicon carbide at a temperature of 500° C. to 1000° C., preferably 800° C. to 1000° C. Preferably, the volume ratio of the silicon carbide particles and the aluminum-containing material is determined so as to satisfy the $(\alpha_1-4) \leq \alpha_2 \leq (\alpha_1+4)$. Otherwise, desirably, the silicon carbide particles/aluminum-containing material volume ratio is 40/60 to 80/20, preferably 60/40 to 70/30. When the silicon carbide particles/aluminum-containing material volume ratio is within the above range, not only can the linear thermal expansion coefficient of the matrix be controlled, but also the matrix comes to show an electric conductivity value and a thermal conductivity value which are closer to those of a metal than to those of a pure ceramic. As a result, not only can a voltage be naturally applied to the matrix, but also a bias can be applied thereto. The average particle diameter of the silicon carbide particles is 10 to 100 μm, preferably 10 to 80 μm, more preferably 15 to 60 μm. When aluminum and silicon are used for the aluminum-containing material to form the matrix, it is preferred for satisfying $(\alpha_1-4) \leq \alpha_2 \leq (\alpha_1+4)$ that the aluminum-containing material should contain 12 to 35% by volume, preferably 16 to 35% by volume, more preferably 20 to 35% by weight, of silicon.

In another embodiment, aluminum oxide ($Al_2O_3$) may be used for the ceramic member to form the matrix, aluminum (Al) or aluminum (Al) and silicon (Si) may be used for the aluminum-containing material to form the matrix, and $Al_2O_3$ may be used as a material for forming the ceramic layer. The material for forming the ceramic layer may contain, for example, $TiO_2$ for adjusting the linear thermal expansion coefficient and the electric characteristics of the ceramic layer. In this case, preferably, the volume ratio of aluminum oxide and the aluminum-containing material is determined so as to satisfy the relationship of $(\alpha_1-4) \leq \alpha_2 \leq (\alpha_1+4)$. Otherwise, desirably, the aluminum oxide/aluminum-containing material volume ratio is 50/50 to 90/10, preferably 70/30 to 85/15. When the aluminum oxide/aluminum-containing material volume ratio is within the above range, not only can the linear thermal expansion coefficient of the matrix be controlled, but also the matrix comes to show an electric conductivity value and a thermal conductivity value which are closer to those of a metal than to those of a pure ceramic. As a result, not only can a voltage be naturally applied to the matrix, but also a bias can be applied thereto. When aluminum and silicon are used for the aluminum-containing material to form the matrix, it is desirable for satisfying the relationship of $(\alpha_1-4) \leq \alpha_2 \leq (\alpha_1+4)$ that the aluminum-containing material should contain 12 to 35% by volume, preferably 16 to 35% by volume, more preferably 20 to 35% by volume, of silicon. Desirably, the average particle diameter of the aluminum oxide is 1 to 100 μm, preferably 10 to 80 μm, more preferably 10 to 60 μm.

In the embodiment in which aluminum oxide is used for the ceramic member to form the matrix and aluminum (Al) and silicon (Si) is used for the aluminum-containing material to form the matrix, the above step (A) preferably comprises the steps of placing the porous ceramic member composed of aluminum oxide in a container and casting a aluminum-containing material of molten aluminum and silicon into the container to fill the aluminum-containing material in the texture of the ceramic member by a high-pressure casting method. In this case, when the molten aluminum-containing material is cast into the container, preferably, the temperature of the ceramic member is 500° C. to 1000° C. When the aluminum-containing material is filled in the texture of the ceramic member by a high-pressure casting method, preferably, the absolute pressure is 200 to 1500 kgf/cm². Otherwise, the above step (A) preferably comprises a step of infiltrating the aluminum-containing material of molten aluminum and silicon into the texture of the ceramic member composed of aluminum oxide particles in a non-pressurized state by a non-pressurized metal infiltration method. The ceramic member can be prepared by preforming an aluminum oxide ceramic powder by a die press forming method, a hydrostatic pressing method, a casting method or a slurry pouring and then sintering the preform composed of aluminum oxide.

In the glass substrate processing apparatus of the present invention, part thereof, for example, a glass substrate supporting stage comprises the composite material, and the composite material is formed of the matrix in which the aluminum-containing material is filled in the texture of the ceramic member, whereby the matrix has intermediate properties between the ceramic member and the aluminum-containing material, and for example, the linear thermal expansion coefficient thereof can be adjusted to an intermediate value between those of the ceramic member and the aluminum-containing material. Therefore, the damage of the ceramic layer, which is conventionally caused by the thermal expansions of the matrix and the ceramic layer can be prevented, and the composite material can be reliably used at high temperatures. Further, since the ceramic layer is formed on the surface of the matrix by a thermal spraying method, a composite material having a large area can be produced, and processing of a glass substrate having a large area can be easily accomplished. Moreover, since the matrix has a high thermal conductivity value, the glass substrate can be effectively heated. Further, since the ceramic layer is provided, the occurrence of metal pollution and the corrosion of the composite material by, for example, halogen gas can be prevented. When the glass substrate processing apparatus is used at a high temperature of approximately 300° C., the damage of the ceramic layer, caused by a difference between the linear thermal expansion coefficient $\alpha_1$ of the matrix and the linear thermal expansion coefficient $\alpha_2$ of the ceramic layer, can be reliably prevented by satisfying the relationship of $(\alpha_1-4) \leq \alpha_2 \leq (\alpha_1+4)$.

In a plasma etching method using etching gas, a deposit of an etching product is excessively formed on a chamber side wall and a ceiling plate of a chamber of an etching apparatus, and as a result, the deposit may become a particle source to impair the etching of a base material. That is, the following problem may occur. The etching product is deposited on the chamber side wall and the ceiling plate before it reaches a discharge portion of the etching apparatus. When etching procedures are repeated, therefore, the etching product deposited on the chamber side wall and the ceiling plate peels off to be a particle source, and as a result, the particle level is downgraded.

In the above case, preferably, the part of the glass substrate processing apparatus constituting the chamber side wall and the ceiling plate comprises the composite material, and the composite material is formed of the matrix in which the aluminum-containing material is filled in the texture of the ceramic member and the ceramic layer formed on the surface of the matrix by a thermal spraying method. Preferably, the composite material is provided with temperature controlling means, and the temperature control means is preferably a heater. The heater may be disposed outside the composite material, or it may be disposed within the matrix. In the latter case, when the matrix has a linear thermal expansion coefficient $\alpha_1$ [unit: $10^{-6}$/K], preferably, a linear thermal expansion coefficient $\alpha_1$ [unit: $10^{-6}$/K] of a material constituting the heater satisfies $(\alpha_1-4) \leq \alpha_H \leq (\alpha_1+4)$. Otherwise, the temperature controlling means may be a piping disposed within the matrix for flowing a temperature-controlling heating medium therein. In this case, when the matrix has a linear thermal expansion coefficient $\alpha_1$ [unit: $10^{-6}$/K], preferably, a linear thermal expansion coefficient $\alpha_P$ [unit: $10^{-6}$/K] of the piping satisfies $(\alpha_1-4) \leq \alpha_P \leq (\alpha_1+4)$. Since the ceramic layer is formed on the surface of the matrix by a thermal spraying method, the glass substrate processing apparatus can be easily produced even if it has large dimensions. In some cases, a plate-like ceramic layer may be attached to the surface of the matrix by brazing.

When the chamber side wall and the ceiling plate comprise the composite material, the matrix has intermediate properties between the ceramic member and the aluminum-containing material, and, for example, the linear thermal expansion coefficient thereof can be adjusted to an intermediate value between those of the ceramic member and the aluminum-containing material. Therefore, the damage of the ceramic layer, caused by the thermal expansions of the matrix and the ceramic layer can be prevented, and the ceramic layer does not suffer damage even when the chamber side wall and the ceiling plate are maintained at a temperature sufficiently high to prevent the deposition of an etching product on the chamber side wall and the ceiling plate, so that the chamber side wall and the ceiling plate can be reliably heated to a predetermined temperature.

A conventional etching apparatus generally has a chamber side wall composed of stainless steel or aluminum. And, on etching, for preventing the pollution of a metal caused by direct exposure of the chamber side wall to plasma or for preventing the corrosion of the chamber side wall caused by a halogen-containing gas, an $Al_2O_3$ layer ("ALMITE" layer) is formed on the surface of the chamber side wall composed of aluminum. When the chamber side wall is composed of stainless steel, a reflector made of $Al_2O_3$ is disposed near the chamber side wall inside the etching apparatus. When the chamber side wall in the above state is heated to a high temperature, and when the chamber side wall is composed of aluminum, the $Al_2O_3$ layer is liable to undergo cracking due to a thermal expansion coefficient difference between aluminum and $Al_2O_3$. When the reflector made of $Al_2O_3$ is disposed near the chamber side wall inside an etching apparatus, it is difficult to fully heat the reflector from outside the etching apparatus. That is, it is difficult to heat the reflector up to a temperature at which an etching product incident on the reflector can be completely eliminated from the reflector, and the reflector can be heated up to approximately 100° C. at the highest.

For example, when plasma etching is carried out on a base material, preferably, part of the glass substrate processing apparatus of the present invention constitutes a parallel-flat-plate upper opposing electrode, and the upper opposing electrode comprises the composite material formed of the matrix in which the aluminum-containing material is filled in the texture of the ceramic member and the ceramic layer formed on the surface of the matrix by a thermal spraying method. In this case, preferably, the upper opposing electrode is provided with temperature control means, and further, the temperature control means is preferably a heater. For example, the upper opposing electrode can be heated up to a temperature at which a precursor incident on the surface of the upper opposing electrode can be eliminated from the upper opposing electrode. The heater may be disposed outside the composite material, or it may be disposed within the matrix. In the latter case, when the matrix has a linear thermal expansion coefficient $\alpha_1$ [unit: $10^{-6}$/K], preferably, a linear thermal expansion coefficient $\alpha_H$ [unit: $10^{-6}$/K] of a material constituting the heater satisfies $(\alpha_1-4) \leq \alpha_H \leq (\alpha_1+4)$. When the linear thermal expansion coefficient $\alpha_1$ of the matrix and the linear thermal expansion coefficient $\alpha_H$ of the material constituting the heater satisfy the above relationship, the occurrence of damage on the ceramic layer can be effectively prevented. Since the ceramic layer is formed on the surface of the matrix by a thermal spraying method, the upper opposing electrode can be easily produced even if the glass substrate processing apparatus has large dimensions. In some cases, a ceramic layer having the form of a plate may be attached to the surface of the matrix by a brazing method.

The treatment on the base material includes etching treatment including plasma etching, CVD treatment including plasma CVD treatment and sputtering treatment including soft etching treatment of the base material.

The base material in the present invention includes various insulating layers or insulating films, electrically conductive films, metal films, metal compound films, and laminates of these formed on a surface of a glass substrate. Examples of the insulating layers or insulating films include layers or films of known materials such as $SiO_2$, BPSG, PSG, BSG, AsSG, PbSG, SbSG, NSG, SOG, LTO (low temperature oxide, low-temperature $CVD-SiO_2$), SiN and SiON, a low-dielectric film and laminates of these. Examples of the electrically conductive films include a film of poly-silicon doped with impurities. Examples of the metal films and metal compound films include films of Cu, Ti, TiN, BST (barium-strontium-titanium oxide), STO (strontium-titanium oxide), SBT (strontium-barium-tantalum oxide), Pt, Al, aluminum alloys containing, for example, copper and silicon, refractory metal such as tungsten and various silicides.

BRIEF DESCRIPTION OF THE DRAWINGS

The present invention will be explained with reference to Examples by referring to drawings.

DESCRIPTION OF THE PREFERRED EMBODIMENTS

EXAMPLE 1

Figure 1A:
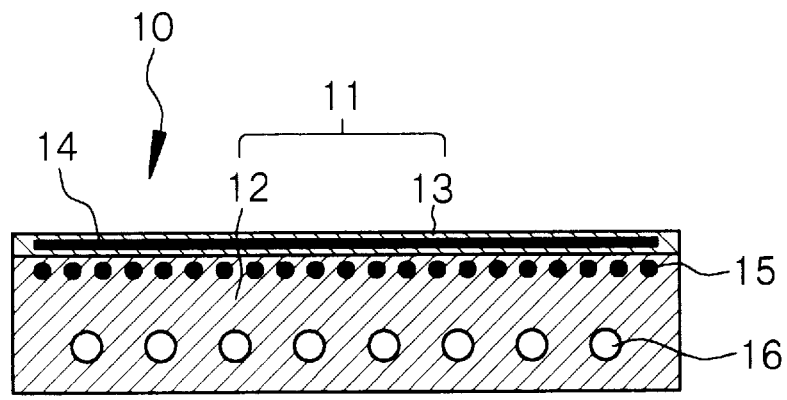
FIGS. 1A and 1B are schematic cross-sectional views of a glass substrate supporting stage in Example 1.
Figure 1B:
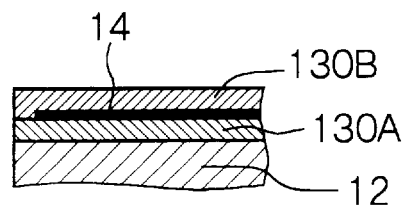

With a glass substrate processing apparatus in Example 1, a base material formed on a glass substrate is etched. Part of the glass substrate processing apparatus comprises a composite material 11, and it is a glass substrate supporting stage having an electrostatic chuck function and having temperature control means. An electrode 14 is formed within a ceramic layer 13, and the ceramic layer 13 has the electrostatic chuck function. FIG. 1A shows a schematic cross-sectional view of the glass substrate supporting stage 10 comprising the composite material 11, and FIG. 1B shows an enlarged cross-sectional view of the top surface end portion of the composite material 11. The glass substrate supporting stage 10 comprises the composite material 11. The composite material 11 is formed of a matrix 12 (corresponding to a temperature adjusting jacket) and the ceramic layer 13. The matrix 12 is formed of a ceramic member and an aluminum-containing material filled in a texture of the ceramic member. The ceramic layer 13 is formed on a surface of the matrix 12 by a thermal spraying method. The matrix 12 has the form of a disc.

In Example 1, the ceramic member for forming the matrix 12 is composed of cordierite ceramic. The cordierite ceramic is ceramic prepared so as to have a composition having an MgO content of about 13% by weight, an $SiO_2$ content of about 52% by weight and an $Al_2O_3$ content of about 35% by weight. The cordierite ceramic has a linear thermal expansion coefficient of $0.1 \times 10^{-6}$/K.

The aluminum-containing material for forming the matrix 12 has a composition containing aluminum (Al) and silicon (Si). In Example 1, the aluminum-containing material contains 20% by volume, based of the aluminum-containing material, of silicon. The ceramic member is a sintered member of a mixture of a cordierite ceramic powder and a cordierite ceramic fiber, and the sintered member has a cordierite ceramic fiber content of 5% by volume. The cordierite ceramic powder has an average particle diameter of 10 µm, and the cordierite ceramic fiber has an average diameter of 3 µm and an average length of 1 mm. The ceramic member has a porosity of approximately 50%, and pores have a diameter of approximately 1 to 2 µm. Therefore, the cordierite ceramic/aluminum-containing material volume ratio is approximately 1/1. The matrix 12 having the above constitution has a linear thermal expansion coefficient of approximately $10.6 \times 10^{-6}$/K as an average value between 100° C. and 300° C. That is, $\alpha_1 = 10.6$. Since the cordierite ceramic/aluminum-containing material volume ratio is approximately 1/1, the matrix 12 has an electric conductivity value and a thermal conductivity value which are closer to those of a metal than to those of a pure ceramic.

$Al_2O_3$ containing approximately 2.5% by weight of $TiO_2$ is used as a material for forming the ceramic layer 13. An electrode 14 is formed within the ceramic layer 13. The ceramic layer 13 is formed on the surface of the matrix 12 by a thermal spraying method. The ceramic layer 13 having the above composition has a linear thermal expansion coefficient of approximately $9 \times 10^{-6}$/K as an average value between 100° C. and 300° C. Therefore, $\alpha_2$ is 9, and the linear thermal expansion coefficient $\alpha_1$ satisfies the relationship of $(\alpha_1 - 4) \leq \alpha_2 \leq (\alpha_1 + 4)$. $Al_2O_3$ itself has a linear thermal expansion coefficient of approximately $8 \times 10^{-6}$/K. Further, the specific volume resistance of the ceramic layer 13 can be adjusted to an order of $10^{11}$ $\Omega/\square$ by adding about 2.5% by weight of $TiO_2$ to $Al_2O_3$, whereby the ceramic layer 13 works as a dielectric layer and can exhibit a function as an electrostatic chuck owing to the electrode 14 formed within it. The reason for the above adjustment of the specific volume resistance value is that when the ceramic layer 13 has a specific volume resistance exceeding an order of $10^{11}$ $\Omega/\square$, the attracting force of the ceramic layer 13 is too low when the ceramic layer 13 is used as an electrostatic chuck, and it may be difficult to allow a glass substrate to be fully attracted to the ceramic layer 13. When the specific volume resistance of the ceramic layer 13 is lower than an order of $10^{11}$ $\Omega/\square$, the resistance value of the ceramic layer 13 further decreases when the glass substrate supporting stage 10 is used at a high temperature, and electric current may flow in an interface between a glass substrate and the ceramic layer 13. Although differing depending upon use conditions, generally, the specific volume resistance value of the ceramic layer is preferably $10^{11}$ to $10^{16}$ $\Omega/\square$.

The temperature control means is provided (embedded) in the matrix 12 of the glass substrate supporting stage 10. The temperature control means comprises a heater 15 and a piping 16 for flowing a temperature-control heating medium therein.

As the heater 15, there is used a large-sized large-capacity sheathed heater matching the area (bottom area) of the matrix 12. The heater 15 is a known heater, and comprises a heater element (not shown) and a sheath (not shown) disposed outside the heater element for protecting the heater element. The heater 15 is connected to a power source through a wiring (not shown). The thermal expansion of the heater 15 influences the glass substrate supporting stage 10. Preferably, the heater 15 is therefore formed of a material having a linear thermal expansion coefficient value close to the linear thermal expansion coefficients $\alpha_1$ and $\alpha_2$ of the matrix 12 and the ceramic layer 13. Specifically, it is preferred to use a sheath composed of a material having a linear thermal expansion coefficient of $9 \times 10^{-6}$/K to $12 \times 10^{-6}$/K, such as titanium or stainless steel. That is, preferably, the linear thermal expansion coefficient $\alpha_1$ [unit: $10^{-6}$/K] of the material constituting the heater 15 (the material for the sheath contacting the matrix 12) satisfies $(\alpha_1 - 4) \leq \alpha_H \leq (\alpha_1 + 4)$. Since a linear thermal expansion coefficient of the heater element has no influence on the glass substrate supporting stage 10, the material constituting the heater element is not critical.

The piping 16 is connected to a temperature-controlling heating medium supply device (not shown in FIG. 1A) and is made of a metal or an alloy. A temperature-controlling heating medium supplied from the temperature-controlling heating medium supply device is flowed through the piping 16 within the glass substrate supporting stage 10, whereby the temperature of the glass substrate supporting stage 10 can be controlled. The thermal expansion of the piping 16 influences the glass substrate supporting stage 10.

Preferably, the piping 16 is therefore composed of a material having a linear thermal expansion coefficient value close to the linear thermal expansion coefficients $\alpha_1$ and $\alpha_2$ of the matrix 12 and the ceramic layer 13. Specifically, it is preferred to use a piping composed of a material having a linear thermal expansion coefficient of $9 \times 10^{-6}$/K to $12 \times 10^{-6}$/K, such as titanium or stainless steel. That is, preferably, the linear thermal expansion coefficient $\alpha_P$ [unit: $10^{-6}$/K] of the material constituting the piping 16 satisfies $(\alpha_1 - 4) \leq \alpha_P > (\alpha_1 + 4)$.

When a direct current is applied to the electrode 14 of the glass substrate supporting stage 10 having the above constitution through a wiring (not shown), the ceramic layer 13 works as an electrostatic chuck. Pusher pins (not shown) are embedded in the glass substrate supporting stage 10, which pusher pins are for pushing up a glass substrate placed and supported on the ceramic layer 13. The pusher pins are provided with a mechanism (not shown) for pushing the pusher pins up above or down from the top surface of the ceramic layer 13.

The method of producing the glass substrate supporting stage 10 comprising the composite material 11 will be explained below. The composite material 11 is produced by a step (A) of filling the aluminum-containing material in the texture of the ceramic member to manufacture the matrix in which the aluminum-containing material is filled in the texture of the ceramic member, and a step (B) of forming the ceramic layer on the surface of the matrix by a thermal spraying method. In Example 1, the step (A) comprises the steps of placing the ceramic member composed of porous cordierite ceramic in a container (mold), and casting the aluminum-containing material composed of aluminum and silicon into the container (mold) to fill the aluminum-containing material in the texture of the ceramic member by a high-pressure casting method.

The ceramic member composed of porous cordierite ceramic is formed as a porous member in a sintering step on the preparation of the ceramic member. As porous cordierite ceramic member, Example 1 uses a porous cordierite ceramic-fiber board (to be abbreviated as "fiber board" hereinafter) which is a sintered member obtained by sintering a mixture of a cordierite ceramic powder and a cordierite ceramic fiber. A general powder-sintered ceramic member is obtained by sintering at a high temperature of 1200° C., while the fiber board is obtained by sintering at a low temperature of approximately 800° C. and is formed into a porous member by sintering so as to have cordierite ceramic powder bonding intimately to surfaces of cordierite ceramic fibers with binders. Therefore, the porosity and the pore diameter of the ceramic member composed of porous cordierite ceramic to be obtained can be adjusted by changing the volume ratio of the cordierite ceramic powder and the cordierite ceramic fiber.

For producing the glass substrate supporting stage 10, first, a first fiber board shaped in the form of a predetermined disc is provided. A groove is made in the first fiber board for disposing the heater 15 therein. Separately, a second fiber board is provided. A groove is made in the second fiber board for disposing the piping 16 therein. Then, the first fiber board is placed on the bottom of the container (mold), and then heater 15 is arranged in the groove made in the first fiber board. The second fiber board is placed on the first fiber board, and the piping 16 is arranged in the groove made in the second fiber board. Further, a third fiber board is placed on the second fiber board. These fiber boards have holes made beforehand for embedding the pusher pins therein.

Then, the ceramic member comprising the above fiber boards is preliminarily heated up to approximately 800° C., and thereafter, the aluminum-containing material (80% by volume of Al—20% by volume of Si) which is brought into a molten state by heating is cast therein. Then, a high-pressure casting method is carried out for applying a high pressure of approximately 1 metric ton/cm$^2$ into the container (mold). As a result, the aluminum-containing material is filled in the porous fiber boards, i.e., the texture of the ceramic member. The aluminum-containing material is cooled to solidness to give the matrix 12.

Figure 1C:
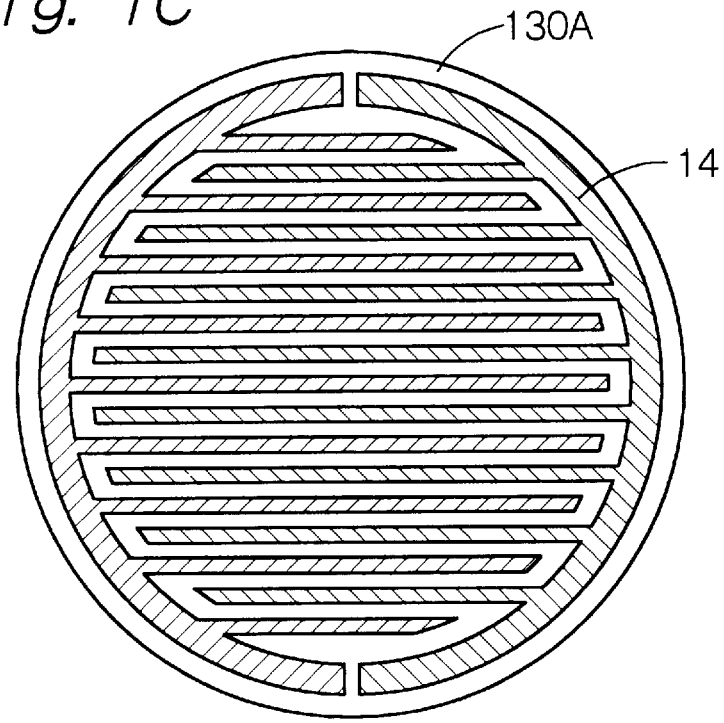
FIG. 1C is a figure showing a plan configuration of an electrode.

Then, the top surface of the matrix 12 is polished. Thereafter, a powder mixture having a particle diameter of about 10 $\mu$m, prepared by mixing $Al_2O_3$ with about 2.5% by weight of $TiO_2$, is sprayed in a fused state onto the polished surface by a vacuum thermal spraying method and solidified, whereby a first ceramic layer 130A having a specific volume resistance value of an order of $10^{11}$ $\Omega/\square$ can be formed by a thermal spraying method. Before the formation of the first ceramic layer 130A, nickel containing approximately 5% by weight of aluminum (Ni-5 wt % Al) may be thermal-sprayed to form a thermal-spray undercoat layer, and the first ceramic layer 130A may be formed on the thermal-spray undercoat layer by a thermal spraying method. Then, a brazing material is used to form the electrode 14 on the first ceramic layer 130A. FIG. 1C schematically shows a plan configuration of the electrode 14. The electrode 14 has the form of a so-called comb-shaped electrode and has a bipolar system. In FIG. 1C, the electrode 14 is indicated by slanting lines for clearly showing the electrode 14. Although not specially limited, the brazing material can be selected from Al—Mg—Ge alloy, titanium alloy, tin alloy, antimony alloy or magnesium alloy. When the matrix has a linear thermal expansion coefficient $\alpha_1$ [unit: $10^{-6}$/K], preferably, a linear thermal expansion coefficient [unit: $10^{-6}$/K] of the brazing material is also in the range of from $(\alpha_1 - 4)$ to $(\alpha_1 + 4)$. When the electrode 14 has a small thickness, almost no problem takes place even if the linear thermal expansion coefficient of the brazing material is outside the above range. Then, a second ceramic layer 130B is formed by spraying a powder mixture having a particle diameter of approximately 10 $\mu$m, which mixture is prepared by mixing $Al_2O_3$ with about 2.5% by weight of $TiO_2$, onto the entire surface by a thermal spraying method while the powder mixture is in a fused state, and solidifying the sprayed powder mixture. In this manner, there can be formed the ceramic layer 13 (first ceramic layer 130A and second ceramic layer 130B) having the electrode 14 formed inside. In Figures other than FIG. 1B, the ceramic layer is shown as one layer.

For studying the breaking prevention of the above-produced ceramic layer 13 of the glass substrate supporting stage 10, the glass substrate supporting stage 10 was subjected to a heat cycle test using a hot air circulation type oven.

(1) The glass substrate supporting stage 10 was placed in the oven and the temperature in the oven was increased up to 300° C. over 30 minutes.

(2) The temperature in the oven was maintained at 300° C. for 20 minutes.

(3) The temperature in the oven was decreased to room temperature over 40 minutes.

(4) The glass substrate supporting stage 10 was taken out of the oven, and its appearance was observed.

The above procedures of (1) to (4) were repeated 10 times to show that no change was found on the appearance of the glass substrate supporting stage 10. It was found that the ceramic layer 13 had no damage such as cracking.

The above-obtained glass substrate supporting stage 10 comprises the matrix (temperature adjusting jacket) 12 which is obtained by filling the aluminum-containing material formed of 80% by volume of Al and 20% by volume of Si in the texture of the ceramic member composed of the porous cordierite ceramic fiber boards, and the linear thermal expansion coefficient $\alpha_1$ of the matrix 12 is close to the linear thermal expansion coefficient $\alpha_2$ of the ceramic layer 13. Therefore, when the glass substrate supporting stage 10 is heated or cooled, the expansion and shrinkage degrees of the matrix 12 and those of the ceramic layer 13 are almost equal. There can be therefore reliably prevented the occurrence of damage such as cracking of the ceramic layer 13, which damage is to be caused, due to a difference between the linear thermal expansion coefficients $\alpha_1$ and $\alpha_2$ of the matrix 12 and the ceramic layer 13, during heating at high temperatures or when the glass substrate supporting stage 10 is brought into room temperature from high temperatures.

The production of the composite material in Example 1 uses the cordierite ceramic fiber boards in particular, and the fiber boards has sufficient resistance against an impact caused when the aluminum-containing material infiltrates the pores thereof during the production by a high-pressure casting method. As a result, the cracking of the fiber boards can be prevented. That is, a ceramic member composed of porous cordierite ceramic obtained by a general powder sintering method is liable to undergo cracking during a high-pressure casting. However, the cracking of the ceramic member during the high-pressure casting can be prevented by using the porous cordierite ceramic fiber board(s).

Since the occurrence of cracking, etc., of the fiber board during the high-pressure casting can be avoided, the occurrence of cracking, etc., of the ceramic layer 13 formed on the surface of the matrix 12 can be more reliably prevented. That is, even if a ceramic member undergoes cracking, an aluminum-containing material filled in a texture of the ceramic member works as a binder, and as a result, a matrix can be obtained. In the so-obtained matrix, however, layers of aluminum-containing material are formed in gaps such as cracks in the so-obtained matrix. As a result, a ceramic layer formed on the matrix can no longer follow temperature changes when the glass substrate supporting stage is used, and the ceramic layer is liable to undergo cracking. That is, the ceramic layer is formed by thermal spraying a powder mixture having a particle diameter of approximately 10 $\mu$m to be integrated onto the matrix, and it is therefore almost free from an influence of thermal expansion of the aluminum-containing material filled in the pores having a diameter of 1 to 2 $\mu$m in the ceramic member. However, the layers formed of aluminum-containing material, which are present in cracks in the ceramic member, have a length and a width greater than those of particles forming the ceramic layer. Therefore, the influence of thermal expansion of these layers formed of aluminum-containing material on the ceramic layer is no longer negligible, and the possibility of the ceramic layer being cracked increases.

Since the ceramic layer 13 is formed on the matrix 12 by a thermal spraying method, the composite material 11 having large dimensions can be easily produced. Further, since the matrix 12 and the ceramic layer 13 are integrated to a far higher degree, not only can a stress between the matrix 12 and the ceramic layer 13 be eased, but also the heat conduction from the matrix 12 to the ceramic layer 13 is promoted, so that the temperature control of a glass substrate held and supported on the ceramic layer 13 can be more smoothly and reliably carried out.

Figure 2:
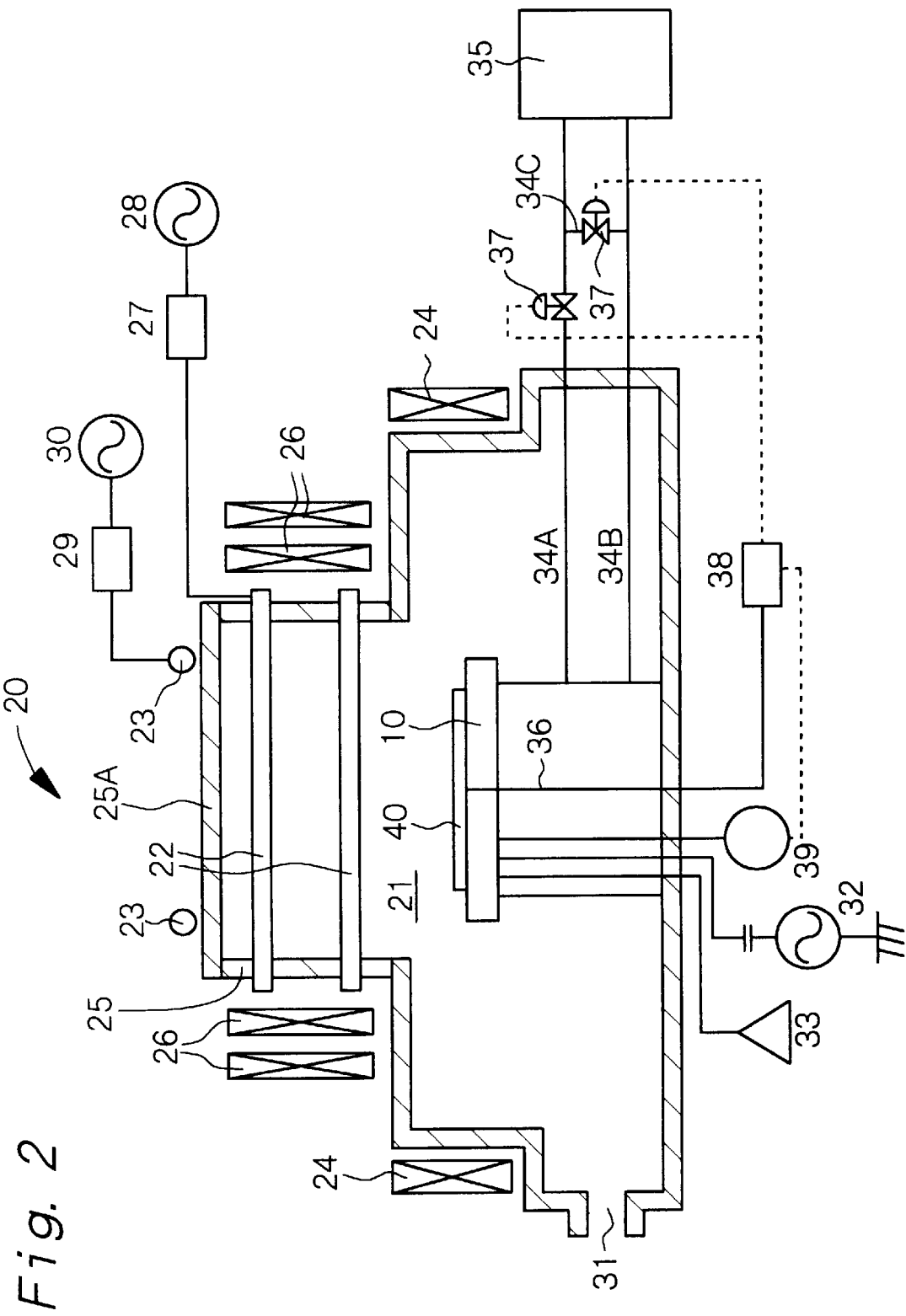
FIG. 2 is a conceptual view of a dry etching apparatus as a glass substrate processing apparatus in Example 1.

FIG. 2 shows a conceptual view of a dry etching apparatus 20 (to be abbreviated as "etching apparatus" hereinafter) which is a glass substrate processing apparatus according to the present invention and having the above glass substrate supporting stage 10 incorporated. The etching apparatus 20 further has a chamber 21, RF antennas 22, an RF antenna 23 and a multi-pole magnet 24.

The two RF antennas 22 are disposed by turning them around a belljar 25 constituting an upper portion of the chamber 21 and one made of cylindrical quartz, and they have an antenna form for generating M=1 mode plasma and are connected to a helicon wave plasma generation source 28 through a matching network 27. Outside these RF antennas 22 is disposed a solenoid coil assembly 26 comprising an inner coil and an outer coil. Of the solenoid coil assembly 26, the inner coil serves to propagate helicon wave, and the outer coil serves to transport the generated plasma. The RF antenna 23 having a form of loop is disposed above a ceiling plate 25A of the chamber 21, and it is connected to a power source 30 through a matching network 29. The ceiling plate 25A is made of quartz. The multi-pole magnet 24 is disposed outside a lower portion of the chamber 21 and forms a cusped magnetic field for preventing the decay of electron on a side wall of the chamber 21.

Inside the chamber 21 is disposed the glass substrate supporting stage 10 (see FIG. 1A) for holding and supporting a glass substrate 40. Further, a discharge outlet 31 for discharging gas in the chamber 21 is connected to negative pressure means (not shown) such as a vacuum pump. A bias power source 32 for controlling incident ion energy on a base material (not shown in FIG. 2) formed on the glass substrate 40 is connected to the glass substrate supporting stage 10. Further, for allowing the ceramic layer 13 to exhibit an electrostatic attracting force, a DC power source 33 is connected to the electrode 14 formed within the ceramic layer 13. The heater 15 disposed within the matrix 12 of the glass substrate supporting stage 10 is connected to a power source 39. Further, the etching apparatus 20 is provided with a fluorescence fiber thermometer 36 for measuring the glass substrate 40 for temperatures.

The piping 16 arranged within the matrix 12 of the glass substrate supporting stage 10 is connected to a temperature-controlling heating medium supply device 35 through pipings 34A and 34B. The temperature-controlling heating medium supply device 35 supplies a temperature-controlling heating medium such as silicone oil to the piping 16 in the glass substrate supporting stage 10 through the piping 34A, receives the temperature-controlling heating medium sent out with the piping 16 through the piping 34B and heats or cools the temperature-controlling heating medium to a predetermined temperature. In some cases, a chiller may be incorporated into the temperature-controlling heating medium supply device 35 to flow a low-temperature temperature-controlling heating medium such as chlorofluorocarbon gas (hydrofluorocarbon gas) in the pipings 34A, 16 and 34B. The glass substrate 40 held and supported on the glass substrate supporting stage 10 is temperature-controlled by circulating the temperature-controlling heating medium in the piping 16 as described above. The piping 34A connected to the temperature-controlling heating medium supply device 35 is provided with a control valve 37 operable at high temperature. Further, a bypass piping 34C located between the pipings 34A and 34B is also provided with a control valve 37. In the above constitution, the supply amount of the temperature-controlling heating medium to the piping 16 is controlled by controlling the open-close degree of the control valves 37. Further, a temperature sensed with the fluorescence fiber thermometer 36 is detected with a control unit (PID controller) 38, and the control unit 38 determines a supply amount of the temperature-controlling heating medium on the basis of a difference of the detected temperature from a predetermined temperature of the glass substrate 40 so as to supply temperature-controlling heating medium in an amount predetermined by experiments and calculations.

In the glass substrate supporting stage 10 shown in FIG. 1A, generally, temperatures are controlled mainly by heating with the heater 15 although temperature control is not always so depending upon the predetermined temperature of the glass substrate 40. The temperature control of the glass substrate supporting stage 10 with the temperature-controlling heating medium is an auxiliary temperature control for stabilizing the temperature of the glass substrate 40. That is, in plasma etching, etc., not only a base material but also the glass substrate 40 receives heat from plasma, and as a result, it is sometimes difficult to maintain the glass substrate 40 at a predetermined temperature by heating with the heater 15 alone. In this case, in addition to heating with the heater 15, the temperature-controlling heating medium having a lower temperature than a predetermined temperature is flowed in the piping 16 so as to offset heat from plasma, for maintaining the glass substrate 40 at the predetermined temperature. In this manner, the glass substrate 40 can be stabilized at the predetermined temperature. In FIG. 2, showing of particulars of etching apparatus such as an etching gas inlet port, a gate valve, etc., is omitted.

When a base material formed on the glass substrate 40 is plasma-etched by means of the etching apparatus 20 shown in FIG. 2, the glass substrate 40 shows almost no temperature increase caused by heat from plasma during etching treatment, and the glass substrate 40 can be stably maintained at a predetermined temperature. Since the temperature (for example, 250° C.) of the glass substrate 40 can be stabilized highly accurately, an excellent anisotropic configuration can be formed in the base material. That is, since the glass substrate supporting stage 10 is allowed to exhibit electrostatic attracting force, the base material can be temperature-controlled with high accuracy which cannot be accomplished by any conventional technique.

EXAMPLE 2

Example 2 is a variant of Example 1. Example 2 differs from Example 1 in that the ceramic member for forming the matrix of the composite material is replaced with aluminum nitride and that the aluminum-containing material for forming the matrix is replaced with aluminum.

Figure 3A:
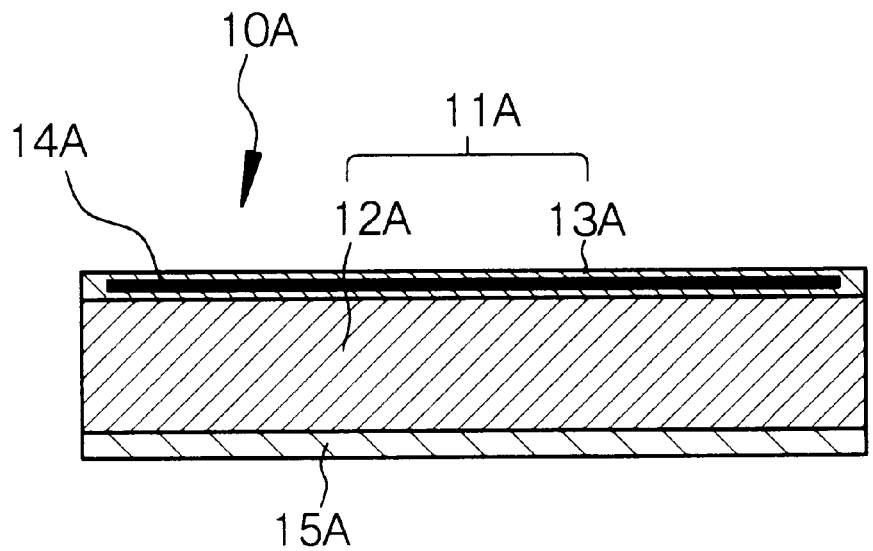
FIGS. 3A and 3B are schematic cross-sectional views of glass substrate supporting stages in Examples 2 and 3.

FIG. 3A shows a schematic cross-sectional view of a glass substrate supporting stage 10A in Example 2 which is part of a glass substrate processing apparatus. The glass substrate supporting stage 10A comprises a composite material 11A. The composite material 11A is formed of a matrix 12A (corresponding to a temperature adjusting jacket) in which the aluminum-containing material is filled in a texture of a ceramic member and a ceramic layer 13A formed on the surface of the matrix 12A by a thermal spraying method. An electrode 14A is formed within the ceramic layer 13A. The matrix 12A has the form of a disc. Unlike Example 1, a heater 15A is attached to a bottom surface of the matrix 12A.

In Example 2, the ceramic member for forming the matrix 12A is composed of aluminum nitride (AlN).

Aluminum nitride has a linear thermal expansion coefficient of $5.1 \times 10^{-6}$/K and a thermal conductivity of 0.235 cal/cm·second·K. Further, the aluminum-containing material for forming the matrix is composed of aluminum (Al). The volume ratio of aluminum nitride and aluminum is determined so as to satisfy $(\alpha_1 - 4) \leq \alpha_2 \leq (\alpha_1 + 4)$, and specifically, the aluminum nitride/aluminum volume ratio is 70/30. The matrix 12A has a linear thermal expansion coefficient of $8.7 \times 10^{-6}$/K as an average between 100° C. and 300° C. That is, $\alpha_1 = 8.7$. The material for forming the ceramic layer 13A is $Al_2O_3$ containing approximately 2.5% by weight of $TiO_2$. The ceramic layer 13A is formed on the surface of the matrix 12A by a thermal spraying method. The ceramic layer 13A has the same structure as that in Example 1. $Al_2O_3$ itself has a linear thermal expansion coefficient of approximately $8 \times 10^{-6}$/K, while $Al_2O_3$ containing $TiO_2$ has a linear thermal expansion coefficient of approximately $9 \times 10^{-6}$/K ($\alpha_2$ is about 9) as an average between 100° C. and 300° C., which value is nearly equivalent to the linear thermal expansion coefficient $\alpha_1$ of the matrix 12A. In this manner, damage such as cracking of the ceramic layer 13A can be effectively prevented even if a temperature change is caused when the matrix 12A is heated at a high temperature. Further, the specific volume resistance of the ceramic layer 13A can be adjusted to an order of $10^{11}$ Ω/□ by adding $TiO_2$ to $Al_2O_3$, whereby the ceramic layer 13A works as a dielectric layer and can effectively exhibit a function as an electrostatic chuck.

A heater 15A is a PBN heater (pyrolytic boron nitride-pyrolytic graphite heater) which can heat up to approximately 400° C. The heater 15A is attached to a bottom surface of the matrix 12A, whereby the matrix 12A can be temperature-controlled in a range of from room temperature to approximately 400° C. When DC current is applied to the electrode 14A of the glass substrate supporting stage 10A through a wiring (not shown), the ceramic layer 13A works as an electrostatic chuck. Pusher pins (not shown) are embedded in the glass substrate supporting stage 10A, which pusher pins are for pushing up a glass substrate placed and supported on the ceramic layer 13A. Further, the pusher pins are provided with a mechanism (not shown) for pushing the pusher pins up above or down from the top surface of the ceramic layer 13A.

The method of producing the glass substrate supporting stage 10A will be explained below. Like Example 1, the composite material 11A is produced by a step (A) of filling an aluminum-containing material in a texture of a ceramic member to manufacture a matrix in which an aluminum-containing material is filled in the texture of the ceramic member and a step (B) of forming a ceramic layer on the surface of the matrix by a thermal spraying method. In Example 2, the step (A) comprises the step of infiltrating the aluminum-containing material composed of molten aluminum into the ceramic member composed of aluminum nitride particles in a non-pressurized state by a non-pressurized metal infiltration method.

Specifically, AlN particles having an average particle diameter of 10 μm are preformed by a slurry pouring method, and then the AlN particles are sintered at a temperature of approximately 800° C., to give the ceramic member which is a preform obtained by shaping the AlN particles. And, the ceramic member is preheated to approximately 800° C., and aluminum which is melted by heating it to approximately 800° C. is infiltrated into the texture of the ceramic member in a non-pressurized state, whereby the matrix 12A formed of 70% by volume of AlN and 30% by volume of Al can be produced. Then, the matrix 12A is processed into the form of a disc-shaped temperature adjusting jacket. The matrix 12A has holes made for embedding the pusher pins, etc., therein. Then, the top surface of the so-obtained matrix 12A is polished.

Then, a powder mixture which is prepared by mixing $Al_2O_3$ with approximately 2.5% by weight of $TiO_2$ and has a particle diameter of approximately 10 μm is sprayed onto the polished surface in a fused state by a vacuum thermal spraying method and is solidified, whereby a first ceramic layer having a specific volume resistance value of an order of $10^{11}$ Ω/□ can be formed by a thermal spraying method. Before the formation of the first ceramic layer, for example, nickel containing approximately 5% by weight of aluminum (Ni-5 wt % Al) may be thermal-sprayed to form a thermal-spray undercoat layer, and the first ceramic layer may be formed on the thermal-spray undercoat layer by a thermal spraying method. Then, the electrode 14 is formed on the first ceramic layer by a thermal spraying method. The electrode 14 has a bipolar system. Then, a powder mixture which is prepared by mixing $Al_2O_3$ with approximately 2.5% by weight of $TiO_2$ and has a particle diameter of approximately 10 μm is sprayed onto the entire surface in a fused state by a vacuum thermal spraying method and then solidified, whereby a second ceramic layer is formed by a thermal spraying method. In this manner, the ceramic layer 13 (first ceramic layer and second ceramic layer) having the electrode 14 formed inside can be formed. Then, the heater 15A which is a PBN heater is attached to the bottom surface of the matrix 12A, i.e., a surface opposite to the surface on which the ceramic layer 13A is formed, to give the glass substrate supporting stage 10A.

In the so-produced glass substrate supporting stage 10A, a linear thermal expansion coefficient $\alpha_2$ of the ceramic layer 13A is nearly equivalent to a linear thermal expansion coefficient $\alpha_1$ of the matrix 12A.

Therefore, even if a temperature change is caused by heating the matrix 12A at a high temperature, the ceramic layer 13A is free from damage such as cracking.

In Example 2, the linear thermal expansion coefficient $\alpha_1$ of the matrix 12A and the linear thermal expansion coefficient $\alpha_2$ of the ceramic layer 13A can be adjusted to satisfy $(\alpha_1-4) \leq \alpha_2 \leq (\alpha_1+4)$ by adjusting the volume ratio of aluminum nitride and aluminum and optionally by adjusting the content of $TiO_2$ in the ceramic layer 13A composed of $Al_2O_3$ as required. As a result, damage such as cracking of the ceramic layer 13A caused by a temperature change of the glass substrate supporting stage 10A can be effectively prevented.

Since the ceramic layer 13A is formed on the matrix 12A by a thermal spraying method, a composite material having a large area can be easily produced, and the processing of a glass substrate having a large area can be easily accomplished. Further, since the matrix 12A and the ceramic layer 13A are integrated to a far higher degree, not only a stress between the matrix 12A and the ceramic layer 13A can be eased, but also the heat conduction from the matrix 12A to the ceramic layer 13A is promoted, so that the temperature control of a glass substrate held and supported on the ceramic layer 13A can be more smoothly and reliably carried out.

Figure 4:
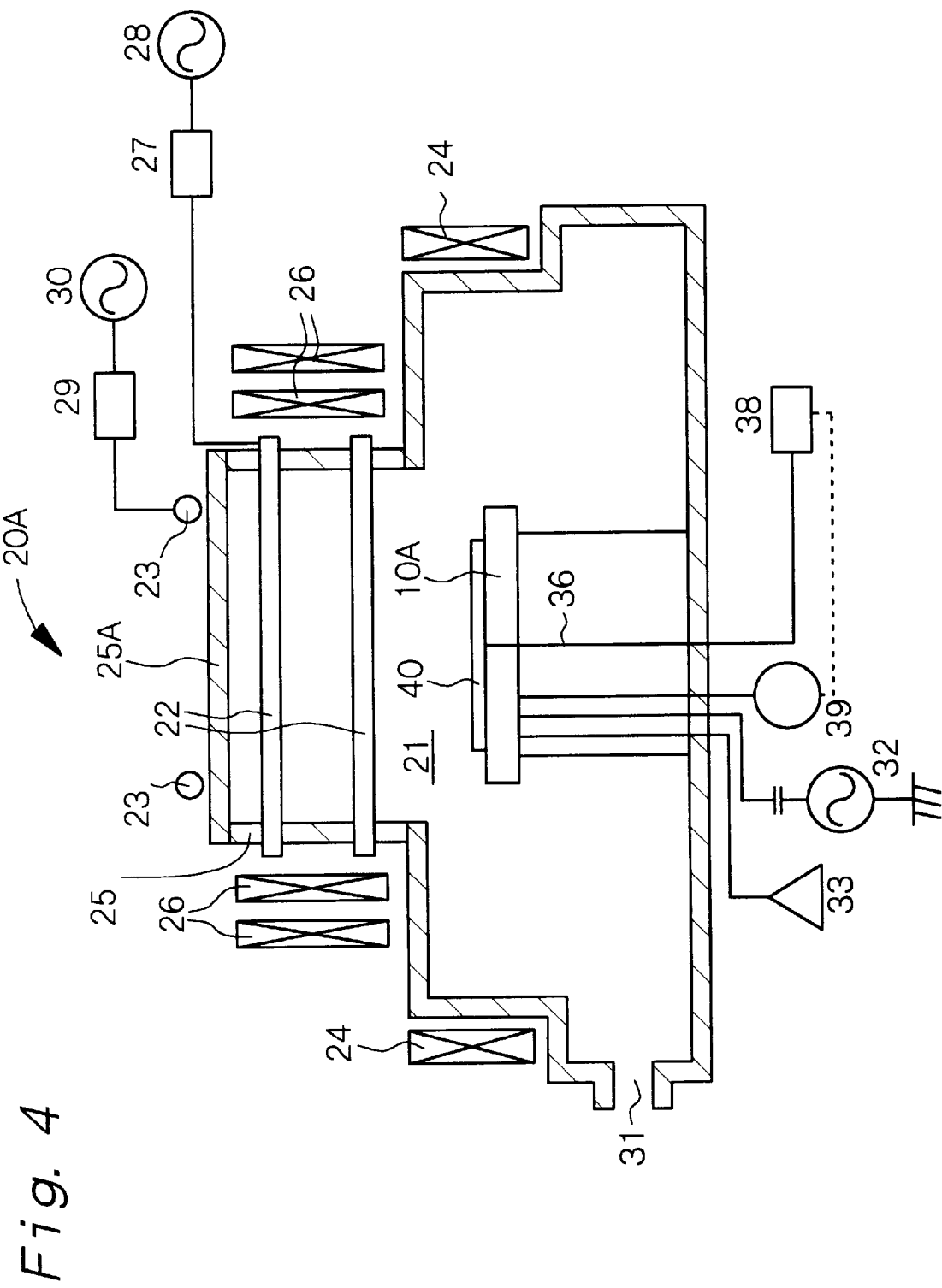
FIG. 4 is a conceptual view of a dry etching apparatus as a glass substrate processing apparatus in Example 2.

The etching apparatus 20A in Example 2, which is a glass substrate processing apparatus having, as part thereof, the above glass substrate supporting stage 10A composed of the composite material 11A, can be substantially the same as the glass substrate processing apparatus explained in Example 1 except for a piping 16 and accessories thereto, as is shown in a conceptual view of FIG. 4. Therefore, detailed explanations thereof are omitted. The temperature of the glass substrate supporting stage 10A can be controlled by detecting a temperature sensed with a fluorescence fiber thermometer 36 with a control device (PID controller) 38 and controlling a power source 39 which is for supplying power to the heater 15A.

The aluminum used for the aluminum-containing material to form the matrix may be replaced with aluminum and silicon. When the aluminum-containing material is composed of aluminum and silicon (for example, 80% by volume of Al and 20% by volume of Si), the linear thermal expansion coefficient $\alpha_1$ of the matrix can be controlled, and the difference of the linear thermal expansion coefficient $\alpha_1$ of the matrix from the linear thermal expansion coefficient $\alpha_2$ of the ceramic layer can be further decreased. Further, $Al_2O_3$ for forming the ceramic layer may be replaced with aluminum nitride (AlN).

EXAMPLE 3

Example 3 is also a variant of Example 1. Example 3 differs from Example 1 in that silicon carbide (SiC) is used for a ceramic member to form the matrix of the composite material and that aluminum (Al) is used for an aluminum-containing material to form the matrix.

Figure 3B:
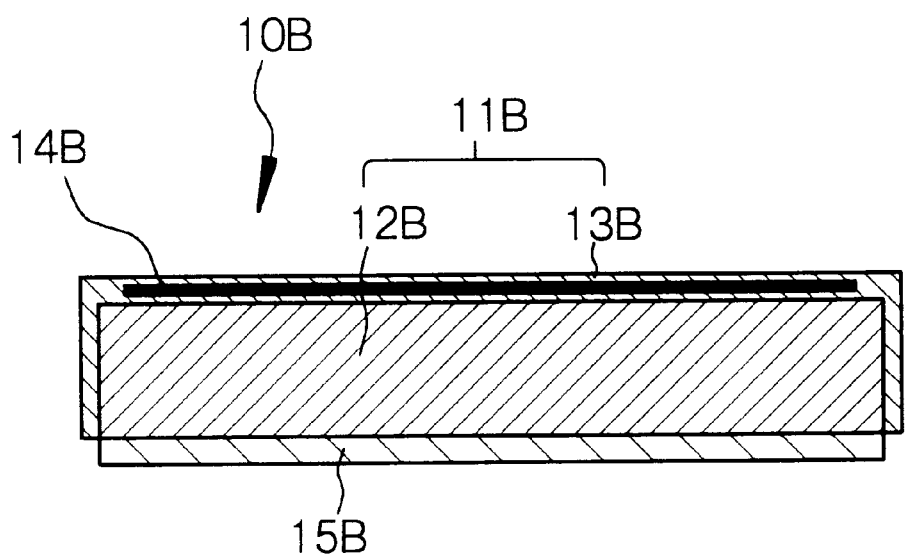

FIG. 3B shows a schematic cross-sectional view of a glass substrate supporting stage 10B in Example 3 which is part of a glass substrate processing apparatus. The glass substrate supporting stage 10B comprises a composite material 11B. The composite material 11B is formed of a matrix 12B (corresponding to a temperature adjusting jacket) in which an aluminum-containing material is filled in a texture of a ceramic member and a ceramic layer 13B formed on top and side surfaces of the matrix 12B by a thermal spraying method. The matrix 12B has the form of a disc. Like Example 2, a heater 15B is attached to a bottom surface of the matrix 12B. Further, the ceramic layer 13B has an electrode 14B formed inside.

In Example 3, silicon carbide (SiC) is used for the ceramic member to form the matrix 12B. Silicon carbide has a linear thermal expansion coefficient of $4 \times 10^{-6}$/K and a thermal conductivity of 0.358 cal/cm·second·K (150 W/m·K). Further, Aluminum (Al) is used for the aluminum-containing material to form the matrix 12B. The volume ratio of silicon carbide and aluminum is determined so as to satisfy $(\alpha_1-4) \leq \alpha_2 \leq (\alpha_1+4)$, and specifically, the silicon carbide/aluminum volume ratio is 70/30. The matrix 12B has a linear thermal expansion coefficient of $6.2 \times 10^{-6}$/K as an average between 100° C. and 300° C. That is, $\alpha_1=6.2$. The material for forming the ceramic layer 13B is $Al_2O_3$ containing approximately 1.5% by weight of $TiO_2$. The ceramic layer 13B is formed on the top and side surfaces of the matrix 12B by a thermal spraying method. $Al_2O_3$ itself has a linear thermal expansion coefficient of approximately $8 \times 10^{-6}$/K, while $Al_2O_3$ containing $TiO_2$ has a linear thermal expansion coefficient of approximately 8 to $9 \times 10^{-6}$/K ($\alpha_2$ is approximately 8 to 9) as an average between 100° C. and 300° C. The relationship between the linear thermal expansion coefficient $\alpha_1$ of the matrix 12B and the linear thermal expansion coefficient $\alpha_2$ of the ceramic layer 13B satisfies $(\alpha_1-4) \leq \alpha_2 \leq (\alpha_1+4)$, whereby damage such as cracking of the ceramic layer 13B can be effectively prevented even if a temperature change is caused when the matrix 12B is heated at a high temperature. Further, the specific volume resistance of the ceramic layer 13B can be adjusted to an order of $10^{11}$ Ω/□ by adding $TiO_2$ to $Al_2O_3$, whereby the ceramic layer 13B effectively functions as an electrostatic chuck.

The heater 15B is a PBN heater like Example 2. The heater 15B is attached to the bottom surface of the temperature adjusting jacket which is the matrix 12B, whereby the matrix 12B can be temperature-controlled in a range of from room temperature to approximately 400° C. When DC current is applied to the electrode 14B through a wiring (not shown), the ceramic layer 13B works as an electrostatic chuck. Pusher pins (not shown) are embedded in the glass substrate supporting stage 10B, which pusher pins are for pushing up a glass substrate placed and supported on the ceramic layer 13B. Further, the pusher pins are provided with a mechanism (not shown) for pushing the pusher pins up above or down from the top surface of the ceramic layer 13B.

The method of producing the glass substrate supporting stage 10B will be explained below. Basically like Example 2, the composite material 11B is produced by a step (A) of filling an aluminum-containing material in a texture of a ceramic member to manufacture a matrix in which an aluminum-containing material is filled in the texture of the ceramic member and a step (B) of forming a ceramic layer on the surface of the matrix by a thermal spraying method. In Example 3, the step (A) comprises the step of infiltrating the aluminum-containing material composed of molten aluminum into the texture of the ceramic member composed of silicon carbide particles in a non-pressurized state by a non-pressurized metal infiltration method.

Specifically, a mixture of SiC particles having an average particle diameter of 15 μm with SiC particles having an average particle diameter of 60 μm in a volume ratio of 1:4 is preformed by a slurry pouring method, and then the mixture is sintered at a temperature of approximately 800° C., to give the ceramic member which is a preform obtained by shaping the SiC particles. And, the ceramic member is pre-heated to approximately 800° C., and aluminum which is melted by heating it to approximately 800° C. is infiltrated into the texture of the ceramic member in a non-pressurized state, whereby the matrix 12B formed of 70% by volume of SiC and 30% by volume of Al can be produced. Then, the matrix 12B is processed into the form of a disc-shaped temperature adjusting jacket. The matrix 12B has holes made beforehand for embedding the pusher pins, etc., therein. Then, the top and side surfaces of the so-obtained matrix 12B are polished.

Then, a powder mixture which is prepared by mixing $Al_2O_3$ with approximately 1.5% by weight of $TiO_2$ and has a particle diameter of approximately 10 μm is sprayed onto the polished surfaces in a fused state by a vacuum thermal spraying method and is solidified, whereby a first ceramic layer having a specific volume resistance value of an order of $10^{11}$ Ω/□ can be formed by a thermal spraying method. Before the formation of the first ceramic layer, for example, nickel containing approximately 5% by weight of aluminum (Ni-5 wt % Al) may be thermal-sprayed to form a thermal-spray undercoat layer, and the first ceramic layer may be formed on the thermal-spray undercoat layer by a thermal spraying method. Then, the electrode 14B is formed on the first ceramic layer by a plating method. The electrode 14B has a bipolar system. Then, a powder mixture which is prepared by mixing $Al_2O_3$ with approximately 1.5% by weight of $TiO_2$ and has a particle diameter of approximately 10 μm is sprayed onto the entire surface in a fused state by a vacuum thermal spraying method and then solidified, whereby a second ceramic layer is formed by a thermal spraying method. In this manner, the ceramic layer 13B (first ceramic layer and second ceramic layer) having the electrode 14B formed inside can be formed. Then, the heater 15B which is a PBN heater is attached to the bottom surface of the matrix 12B, i.e., a surface opposite to the top surface on which the ceramic layer 13B is formed, to give the glass substrate supporting stage 10B.

The method of producing the glass substrate supporting stage 10B is not limited to the above-described method. Like Example 1, the above step (A) may comprise the steps of placing a ceramic member composed of silicon carbide in a container (mold), and casting an aluminum-containing material composed of molten aluminum into the container (mold) to fill the aluminum-containing material in the texture of the ceramic member by a high-pressure casting method. That is, for producing the glass substrate supporting stage 10B, first, a preform composed of SiC shaped in a predetermined disc form is prepared. The preform has holes made beforehand for embedding the pusher pins, etc., therein. The ceramic member (preform) is preheated to approximately 800° C., and then aluminum which is melted by heating it to approximately 800° C. is flowed into the container (mold). Then, a high-pressure casting method is carried out to apply a high pressure of approximately 1 metric ton/cm² into the container (mold). As a result, aluminum is filled in the texture of the ceramic member. And, the aluminum is cooled to solidness to obtain the matrix 12B. Thereafter, the above-described procedures can be carried out to produce the glass substrate supporting stage 10B.

In the so-produced glass substrate supporting stage 10B, even if a temperature change is caused by heating the matrix 12B at a high temperature, the ceramic layer 13B is free from damage such as cracking. In Example 3, the linear thermal expansion coefficient $\alpha_2$ of the matrix 12B and the linear thermal expansion coefficient $\alpha_2$ of the ceramic layer 13B can be adjusted to satisfy $(\alpha_1-4) \leq \alpha_2 \leq (\alpha_1+4)$ by adjusting the volume ratio of silicon carbide and the aluminum-containing material and optionally by adjusting the content of $TiO_2$ in the ceramic layer 13B composed of $Al_2O_3$ as required. As a result, damage such as cracking of the ceramic layer 13B caused by a temperature change of the glass substrate supporting stage 10B can be effectively prevented.

Since the ceramic layer 13B is formed on the matrix 12B by a thermal spraying method, a composite material having a large area can be easily produced, and the processing of a glass substrate having a large area can be easily accomplished. Further, since the matrix 12B and the ceramic layer 13B are integrated to a far higher degree, not only a stress between the matrix 12B and the ceramic layer 13B can be eased, but also the heat conduction from the matrix 12B to the ceramic layer 13B is promoted, so that the temperature control of a glass substrate held and supported on the ceramic layer 13B can be more smoothly and reliably carried out.

The aluminum used for the aluminum-containing material to form the matrix may be replaced with aluminum and silicon (for example, 80% by volume of Al and 20% by volume of Si). When the aluminum-containing material is composed of aluminum and silicon, the linear thermal expansion coefficient $\alpha_1$ of the matrix can be controlled, and the difference between the linear thermal expansion coefficient $\alpha_1$ of the matrix and the linear thermal expansion coefficient $\alpha_2$ of the ceramic layer can be further decreased. Further, $Al_2O_3$ for forming the ceramic layer may be replaced with aluminum nitride (AlN).

Figure 5:
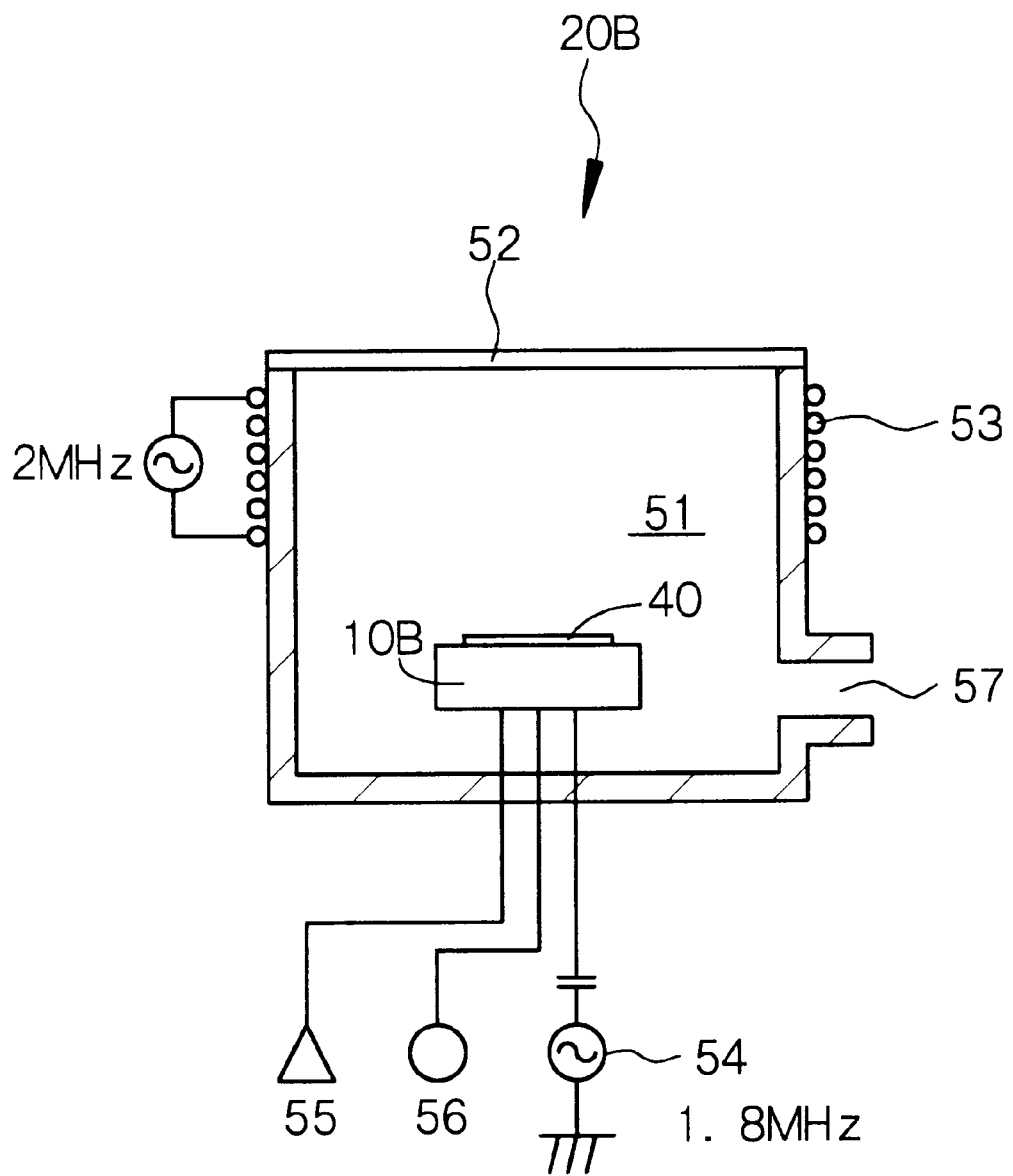
FIG. 5 is a conceptual view of a dry etching apparatus as a glass substrate processing apparatus in Example 3.

FIG. 5 shows a conceptual view of the etching apparatus of Example 3, which is a glass substrate processing apparatus having, as part thereof, the above glass substrate supporting stage 10B. The glass substrate supporting stage 10B comprises the composite material 11B. The etching apparatus 20B is an ICP (inductive coupled plasma) type dry etching apparatus. The etching apparatus 20B has a chamber 51 made of quartz, a ceiling plate 52 and an induction coupled coil 53 disposed outside a side wall of the chamber 51.

Inside the chamber 51 is disposed the glass substrate supporting stage 10B (see FIG. 3B) for holding and supporting a glass substrate 40. Further, a discharge outlet 57 for discharging gas in the chamber 51 is connected to negative pressure means (not shown) such as a vacuum pump. A bias power source 54 for controlling incident ion energy on the glass substrate 40 is connected to the glass substrate supporting stage 10B. Further, for allowing the ceramic layer 13B to exhibit an electrostatic attracting force, a DC power source 55 is connected to the electrode 14B. The heater 15B disposed on the matrix 12B of the glass substrate supporting stage 10B is connected to a power source 56. Further, the etching apparatus 20B is provided with a fluorescence fiber thermometer (not shown) for measuring the glass substrate 40 for temperatures. The temperature of the glass substrate supporting stage 10B can be controlled by detecting a temperature sensed with the fluorescence fiber thermometer with a control device (PID controller) (not shown) and controlling the power source 56 which is for supplying power to the heater 15B. The ceiling plate 52 is preferably formed of a composite material as will be explained later.

EXAMPLE 4

Example 4 is also a variant of Example 1. Example 4 differs from Example 1 in that aluminum oxide ($Al_2O_3$) is used for a ceramic member to form the matrix of the composite material and that aluminum is used for an aluminum-containing material to form the matrix. The glass substrate supporting stage 10B in Example, 4, which comprises the composite material and is part of a glass substrate processing apparatus, is as shown in FIG. 3B. That is, the composite material in Example 4 has the same structure as that of the composite material 11B explained in Example 3.

In Example 4, aluminum oxide ($Al_2O_3$) is used for a ceramic member to form the matrix 12B. Aluminum oxide has a linear thermal expansion coefficient of $7.8 \times 10^{-6}$/K and a thermal conductivity of 0.069 cal/cm·second·K (29 W/m·K). Further, Aluminum (Al) is used for an aluminum-containing material to form the matrix 12B. The volume ratio of aluminum oxide and aluminum is determined so as to satisfy $(\alpha_1-4) \leq \alpha_2 \leq (\alpha_1+4)$, and specifically, the aluminum oxide/aluminum volume ratio is 80/20. The matrix 12B has a linear thermal expansion coefficient of $11 \times 10^{-6}$/K as an average between 100° C. and 300° C. That is, $\alpha_1 = 11$. The material for forming the ceramic layer 13B is $Al_2O_3$ containing approximately 1.5% by weight of $TiO_2$. The ceramic layer 13B is formed on the top and side surfaces of the matrix 12B by a thermal spraying method. The relationship between the linear thermal expansion coefficient $\alpha_1$ of the matrix 12B and the linear thermal expansion coefficient $\alpha_2$ of the ceramic layer 13B satisfies $(\alpha_1-4) \leq \alpha_2 \leq (\alpha_1+4)$, whereby damage such as cracking of the ceramic layer 13B can be effectively prevented even if a temperature change is caused when the matrix 12B is heated at a high temperature. Further, the specific volume resistance of the ceramic layer 13B can be adjusted to an order of $10^{11}$ Ω/□ by adding $TiO_2$ to $Al_2O_3$, whereby the ceramic layer 13B effectively functions as an electrostatic chuck.

The method of producing the glass substrate supporting stage 10B in Example 4 will be explained below. Basically like Example 2, the composite material 11B is produced by a step (A) of filling an aluminum-containing material in a texture of a ceramic member to manufacture a matrix in which the aluminum-containing material is filled in the texture of the ceramic member and a step (B) of forming a ceramic layer on the surface of the matrix by a thermal spraying method. In Example 4, the step (A) comprises the step of infiltrating the aluminum-containing material composed of molten aluminum into the texture of the ceramic member composed of aluminum oxide in a non-pressurized state by a non-pressurized metal infiltration method.

Specifically, a mixture of $Al_2O_3$ particles having an average particle diameter of 20 μm with $Al_2O_3$ particles having an average particle diameter of 80 μm in a volume ratio of 1:4 is preformed by a slurry pouring method, and then the mixture is sintered at a temperature of approximately 800° C., to give the ceramic member which is a preform obtained by shaping the $Al_2O_3$ particles. And, the ceramic member is pre-heated to approximately 800° C., and aluminum which is melted by heating it to approximately 800° C. is infiltrated into the ceramic member in a non-pressurized state, whereby the matrix 12B formed of 80% by volume of $Al_2O_3$ and 20% by volume of Al can be produced. Then, the matrix 12B is processed into the form of a disc-shaped temperature adjusting jacket. The matrix 12B has holes made beforehand for embedding the pusher pins, etc., therein. Then, the top and side surfaces of the so-obtained matrix 12B are polished.

Then, a powder mixture which is prepared by mixing $Al_2O_3$ with approximately 1.5% by weight of $TiO_2$ and has a particle diameter of approximately 10 μm is sprayed onto the polished surfaces in a fused state by a vacuum thermal spraying method and is solidified, whereby a first ceramic layer having a specific volume resistance value of an order of $10^{11}$ Ω/□ can be formed by a thermal spraying method. Before the formation of the first ceramic layer, for example, nickel containing approximately 5% by weight of aluminum (Ni-5 wt % Al) may be thermal-sprayed to form a thermal-spray undercoat layer, and the first ceramic layer may be formed on the thermal-spray undercoat layer by a thermal spraying method. Then, the electrode 14B is formed on the first ceramic layer by a printing method in which an electrically conductive paste is printed and cured. The electrode 14B has a bipolar system. Then, a powder mixture which is prepared by mixing $Al_2O_3$ with approximately 2.5% by weight of $TiO_2$ and has a particle diameter of approximately 10 μm is sprayed onto the entire surface in a fused state by a vacuum thermal spraying method and then solidified, whereby a second ceramic layer is formed by a thermal spraying method.

In this manner, the ceramic layer 13B (first ceramic layer and second ceramic layer) having the electrode 14B formed inside can be formed. Then, the heater 15B which is a PBN heater is attached to the bottom surface of the matrix 12B, i.e., a surface opposite to the top surface on which the ceramic layer 13B is formed, to give the glass substrate supporting stage 10B.

The method of producing the glass substrate supporting stage 10B is not limited to the above-described method. Like Example 1, the above step (A) may comprise the steps of placing a ceramic member composed of aluminum oxide in a container (mold), and casting an aluminum-containing material composed of molten aluminum into the container (mold) to fill the aluminum-containing material in the texture of the ceramic member by a high-pressure casting method. That is, for producing the glass substrate supporting stage 10B, first, a preform composed of $Al_2O_3$ and shaped in a predetermined disc form is prepared. The ceramic member (preform) has holes made beforehand for embedding the pusher pins, etc., therein. The ceramic member is preheated to approximately 800° C., and then aluminum which is melted by heating it to approximately 800° C. is flowed into the container (mold). Then, a high-pressure casting method is carried out to apply a high pressure of approximately 1 metric ton/cm² into the container (mold). As a result, aluminum is filled in the texture of the ceramic member. And, the aluminum is cooled to solidness to obtain the matrix 12B. Thereafter, the above-described procedures can be carried out to produce the glass substrate supporting stage 10B.

In the so-produced glass substrate supporting stage 10B, even if a temperature change is caused by heating the matrix 12B at a high temperature, the ceramic layer 13B is free from damage such as cracking. In Example 4, the relationship between the linear thermal expansion coefficient $\alpha_1$ of the matrix 12B and the linear thermal expansion coefficient $\alpha_2$ of the ceramic layer 13B can be adjusted to satisfy $(\alpha_1-4) \leq \alpha_2 \leq (\alpha_1+4)$ by adjusting the volume ratio of aluminum oxide and the aluminum-containing material and optionally by adjusting the content of $TiO_2$ in the ceramic layer 13B composed of $Al_2O_3$ as required. As a result, damage such as cracking of the ceramic layer 13B caused by a temperature change of the glass substrate supporting stage 10B can be effectively prevented.

Since the ceramic layer 13B is formed on the matrix 12B by a thermal spraying method, a composite material having a large area can be easily produced, and the processing of a glass substrate having a large area can be easily accomplished. Further, since the matrix 12B and the ceramic layer 13B are integrated to a far higher degree, not only can a stress between the matrix 12B and the ceramic layer 13B be eased, but also the heat conduction from the matrix 12B to the ceramic layer 13B is promoted, so that the temperature control of a glass substrate held and supported on the ceramic layer 13B can be more smoothly and reliably carried out.

The aluminum used for the aluminum-containing material to form the matrix may be replaced with aluminum and silicon (for example, 80% by volume of Al and 20% by volume of Si). When the aluminum-containing material is composed of aluminum and silicon, the linear thermal expansion coefficient $\alpha_1$ of the matrix can be controlled, and the difference between the linear thermal expansion coefficient $\alpha_1$ of the matrix and the linear thermal expansion coefficient $\alpha_2$ of the ceramic layer can be further decreased. Further, $Al_2O_3$ for forming the ceramic layer may be replaced with aluminum nitride (AlN).

EXAMPLE 5

Example 5 is a variant of Example 1. In a glass substrate processing apparatus in Example 5, plasma CVD treatment is carried out on a base material formed on a glass substrate.

That is, like Example 1, in Example 5, a glass substrate supporting stage comprises a composite material. The composite material is formed of a matrix and a ceramic layer composed of $Al_2O_3$ on a surface of the matrix by a thermal spraying method. The matrix is formed of a ceramic member composed of cordierite ceramic and an aluminum-containing material composed of aluminum and silicon. The aluminum-containing material is filled in a texture of the ceramic member. The glass substrate processing apparatus has a glass substrate supporting stage which itself is structurally the same as the glass substrate supporting stage 10 explained in Example 1.

Figure 6:
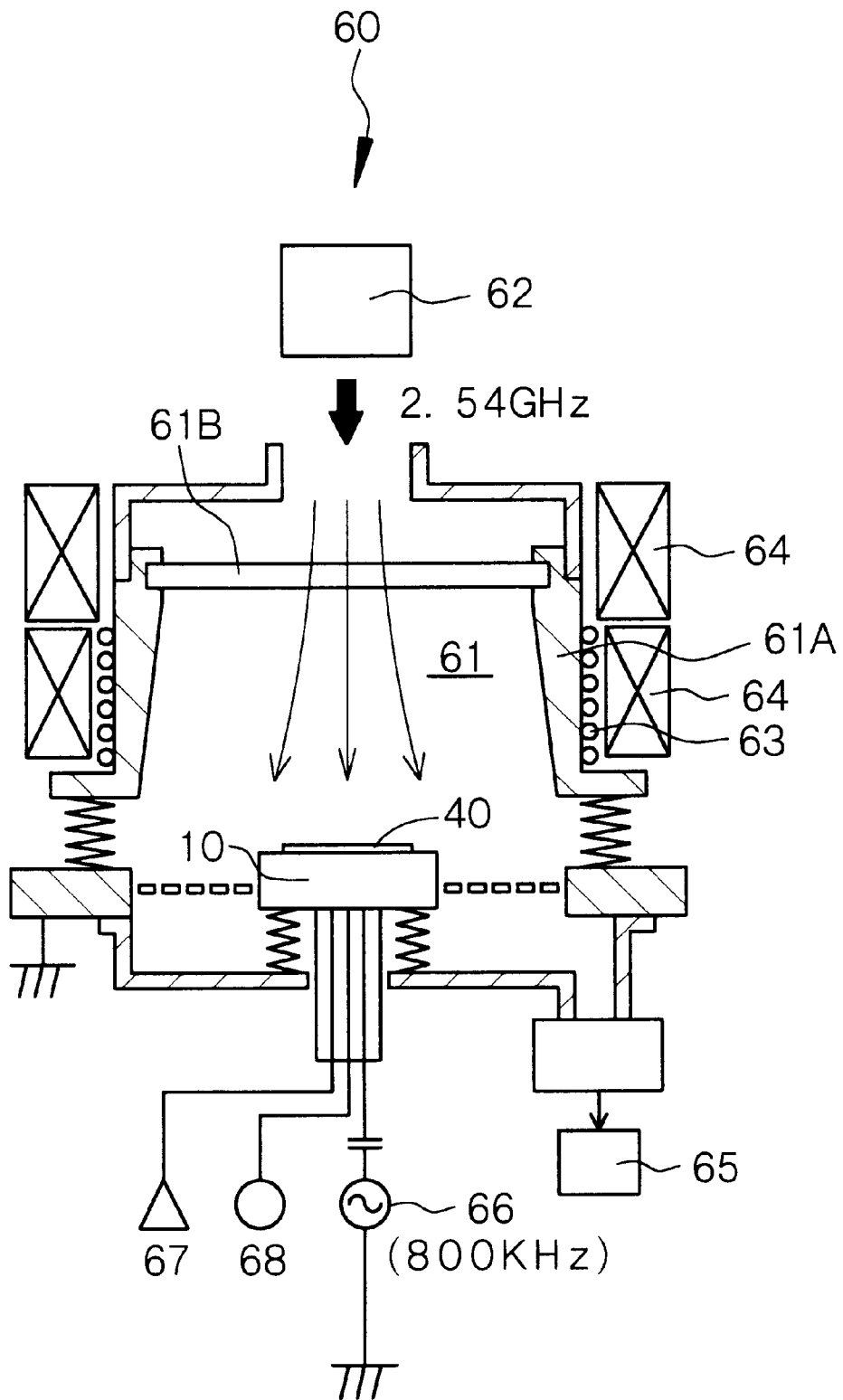
FIG. 6 is a conceptual view of a plasma CVD apparatus as a glass substrate processing apparatus in Example 5.

The glass substrate processing apparatus in Example 5, i.e., a plasma CVD apparatus (more specifically a bias ECR CVD apparatus) will be outlined with reference to FIG. 6 hereinafter.

The bias ECR CVD apparatus 60 (to be abbreviated as "CVD apparatus" hereinafter) has a chamber 61 having a chamber side wall 61A formed of an aluminum block and the glass substrate supporting stage 10 shown in FIG. 1. The glass substrate supporting stage 10 is disposed on the bottom of the chamber 61. The chamber side wall 61A is preferably formed of a composite material as will be explained later.

A window 61B formed of quartz is arranged on a top surface of the chamber 61. Above the window 61B is disposed microwave generation means 62. Further, a heater 63 is disposed on a circumferential outer surface of the side wall 61A and can heat an inside of the chamber 61 to a predetermined temperature. Solenoid coils 64 are disposed around a circumferential upper portion of the chamber 61. Further, a pump 65 is disposed on a gas discharge side of the chamber 61. An RF bias power source 66 is connected to the glass substrate supporting stage 10. A DC power source 67 is connected to the electrode 14 to allow the ceramic layer 13 to exhibit an electrostatic attracting force. Further, the heater 15 disposed within the matrix 12 is connected to a power source 68. It is omitted to show the pipings 34A, 34B and 34C, the temperature-controlling heating medium supply device 35, the fluorescent fiber thermometer 36, the control valves 37 and the control unit (PID controller) 38.

In the CVD apparatus having the above constitution, ECR discharge arises by means of the resonance of microwave supplied from the microwave generation means 62 through the window 61B and a magnetic field generated by the solenoid coils 64, and ions generated therein are incident on the glass substrate 40 on the glass substrate supporting stage 10. In the above system, therefore, the CVD apparatus 60 can materialize high-accuracy gap-fill performance. The CVD apparatus has a piping (not shown) for supplying source gas for CVD treatment into the chamber 61.

The structure and constitution of the glass substrate supporting stage in Example 5 may be replaced with those of the glass substrate supporting stage explained in Examples 2 to 4. In CVD apparatus, the piping 16 and its accessories may be omitted depending upon some structure of the glass substrate supporting stage.

EXAMPLE 6

Example 6 is also a variant of Example 1. In a glass substrate processing apparatus in Example 6, sputtering is carried out on a base material formed on a glass substrate.

That is, like Example 1, in Example 6, a glass substrate supporting stage comprises a composite material. The composite material is formed of a matrix and a ceramic layer composed of $Al_2O_3$ on a surface of the matrix by a thermal spraying method. The matrix is formed of a ceramic member composed of cordierite ceramic and an aluminum-containing material composed of aluminum and silicon. The aluminum-containing material is filled in a texture of the ceramic member.

Figure 7:
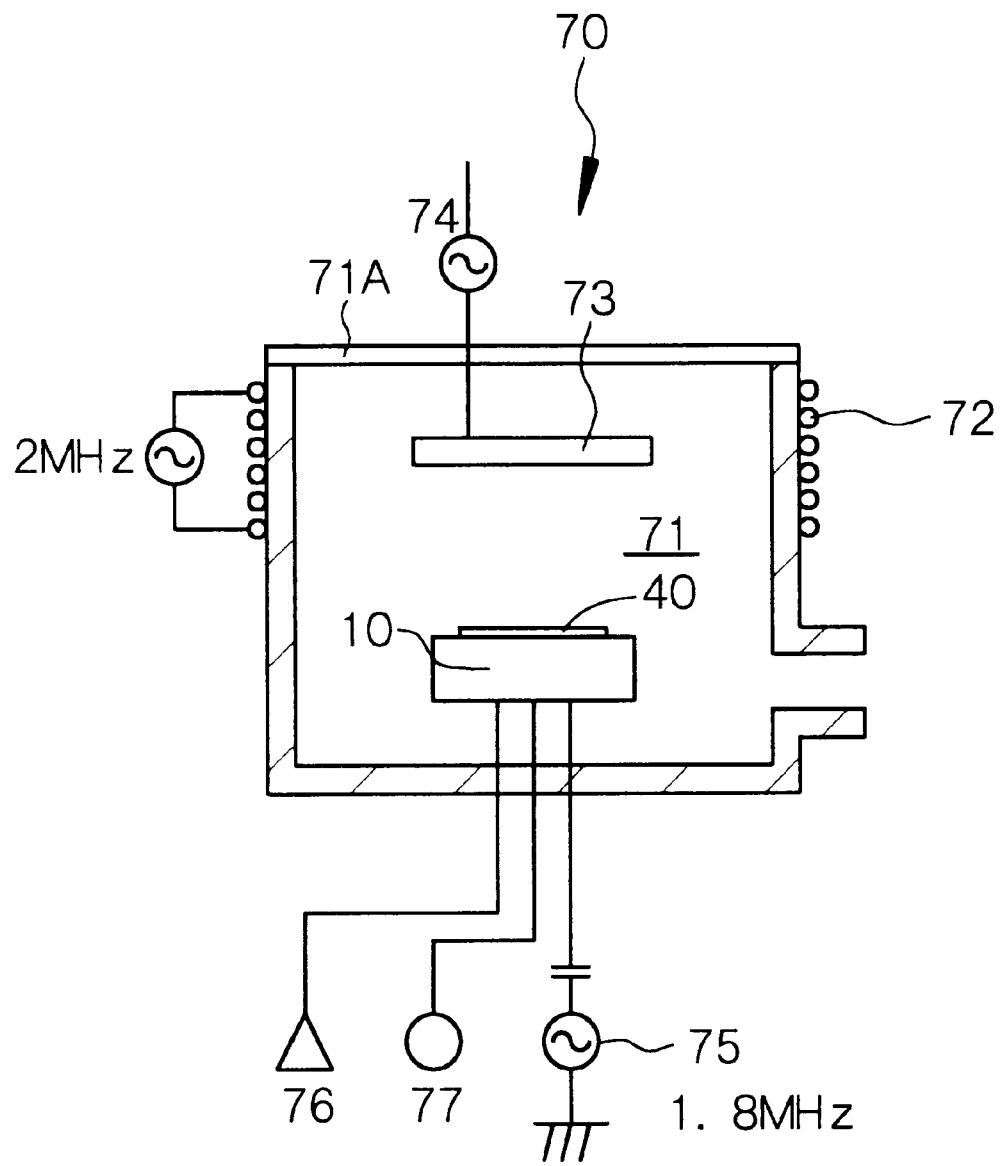
FIG. 7 is a conceptual view of a sputtering apparatus as a glass substrate processing apparatus in Example 6.

The glass substrate processing apparatus in Example 6, i.e., a sputtering apparatus will be outlined with reference to FIG. 7 hereinafter.

The sputtering apparatus 70 has the glass substrate supporting stage 10 shown in FIG. 1A in an ICP type chamber 71. A ceiling plate 71A of the chamber 71 is made of quartz. An induction coupled coil 72 is disposed on an outer surface of a side wall of the chamber 71. Reference numeral 73 indicates a target.

The target 73 is connected to a high-frequency power source 74. A high-frequency power source 75 is connected to the glass substrate supporting stage 10.

Further, a DC power source 76 is connected to the electrode 14 for allowing the ceramic layer 13 to exhibit an electrostatic attraction force. Further, the heater 15 disposed within the matrix 12 is connected to a power source 77. It is omitted to show the pipings 34A, 34B and 34C, the temperature-controlling heating medium supply device 35, the fluorescence fiber thermometer 36, the control valves 37 and the control unit (PID controller) 38. The sputtering apparatus 70 has pipings for introducing various process gases, while showing of these pipings is also omitted. The ceiling plate 71A may be formed of a composite material as will be explained later.

The structure and constitution of the glass substrate supporting stage in Example 6 may be replaced with those of the glass substrate supporting stage explained in Examples 2 to 4.

The present invention has been explained with reference to Examples, while the present invention shall not be limited thereto. The structures of the glass substrate processing apparatus explained in Examples are presented for illustrative purposes and may be modified in design as required. Further, the various processing conditions explained in Examples are also presented for illustrative purposes and may be modified as required. Further, the compositions of the composite materials and the physical properties of cordierite ceramic fiber boards are presented for illustrative purpose and may be modified as required. The glass substrate processing apparatus and the glass substrate supporting stages explained in Examples may be combined as required.

In Examples, the electrode 14 has a so-called comb-shaped electrode form when viewed as a plan view (see FIG. 1C), while the form of the electrode 14 shall not be limited thereto. For example, when viewed as a plan view, the electrode 14 may have a pair of any forms such as two semi-circular forms obtained by dividing a circle into two. Depending upon processing of a base material or upon processing conditions, the electrode may have a single-polar system, or there may be used a single-polar system in which the electrode is omitted and the glass substrate supporting stage is used as an electrode. In the latter case, a DC power source can be connected to the matrix for allowing the ceramic layer to exhibit an electrostatic attracting force.

Figure 8A:
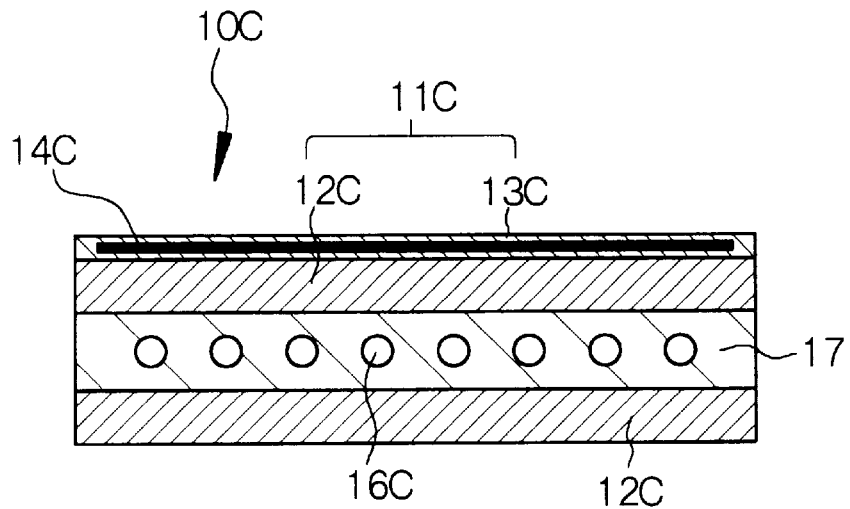
FIGS. 8A, 8B and 8C are schematic cross-sectional views of glass substrate supporting stages having other configurations.
Figure 8B:
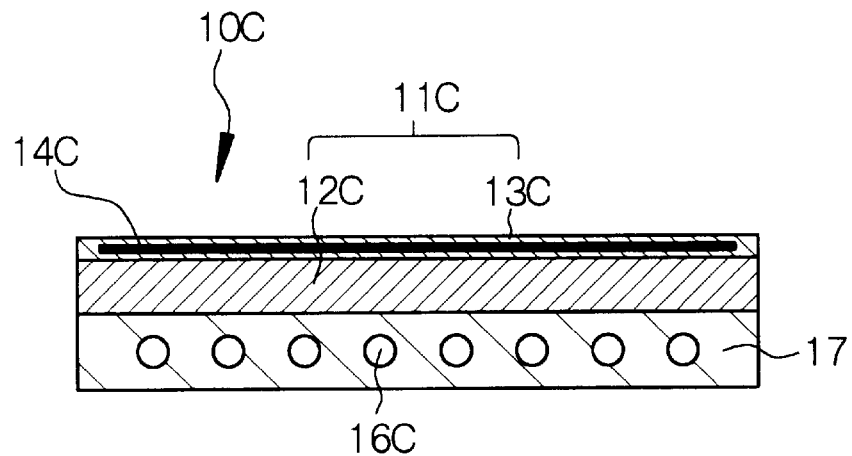
Figure 8C:
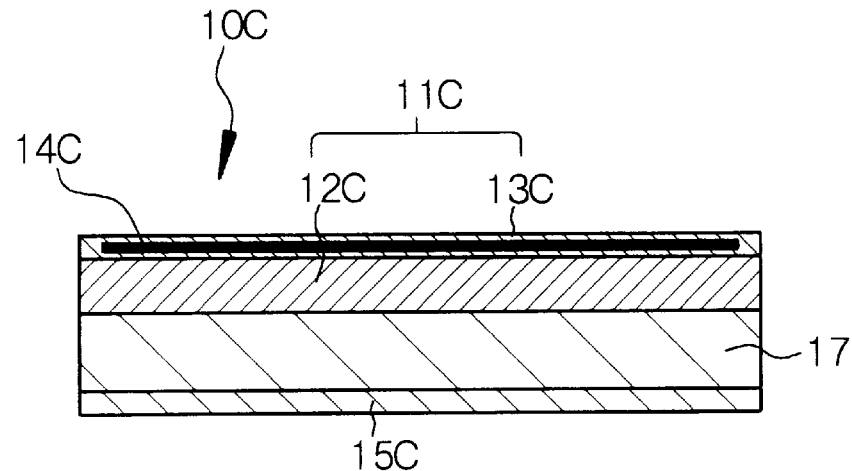

In Examples, the integrally formed matrices are used to produce the glass substrate supporting stages, while the glass substrate supporting stages can be produced, for example, from a combination of an aluminum material and the matrix. FIGS. 8A, 8B and 8C show schematic cross-sectional views of such glass substrate supporting stages. A glass substrate supporting stage 10C is produced by fixing a composite material 11C to a disc-shaped material 17 made of aluminum by brazing or screwing. The brazing material or the screws are not shown in FIGS. 8A, 8B and 8C and FIGS. 11A, 11B, 14A, 14B and 14C to be explained later.

In structures shown in FIGS. 8A, 8B and 8C, the top surface of the glass substrate supporting stage 10C is covered with a ceramic layer 13C by a thermal spraying method. A side surface of the glass substrate supporting stage 10C may be covered with the ceramic layer 13C as required. In FIG. 8A, a piping 16C is disposed within a disc-shaped material 17 made of aluminum. Further, a matrix 12C is fixed on the upper surface of the disc-shaped material 17 and a matrix 12C is also fixed on the lower surface of the disc-shaped material 17. The structure of the composite material 11C fixed on the upper surface of the disc-shaped material 17 and the constitution of the matrix 12C fixed on the lower surface of the disc-shaped material 17 can be the same as those of the composite material and the matrices explained in Examples 1 to 4. In FIG. 8B, the matrix on the lower surface of the disc-shaped material made of aluminum is omitted. In FIG. 8C, a PBN heater 15C is attached to the lower surface of the disc-shaped material 17 made of aluminum. And, the composite material 11C is fixed on the upper surface of the disc-shaped material 17.

Figure 9:
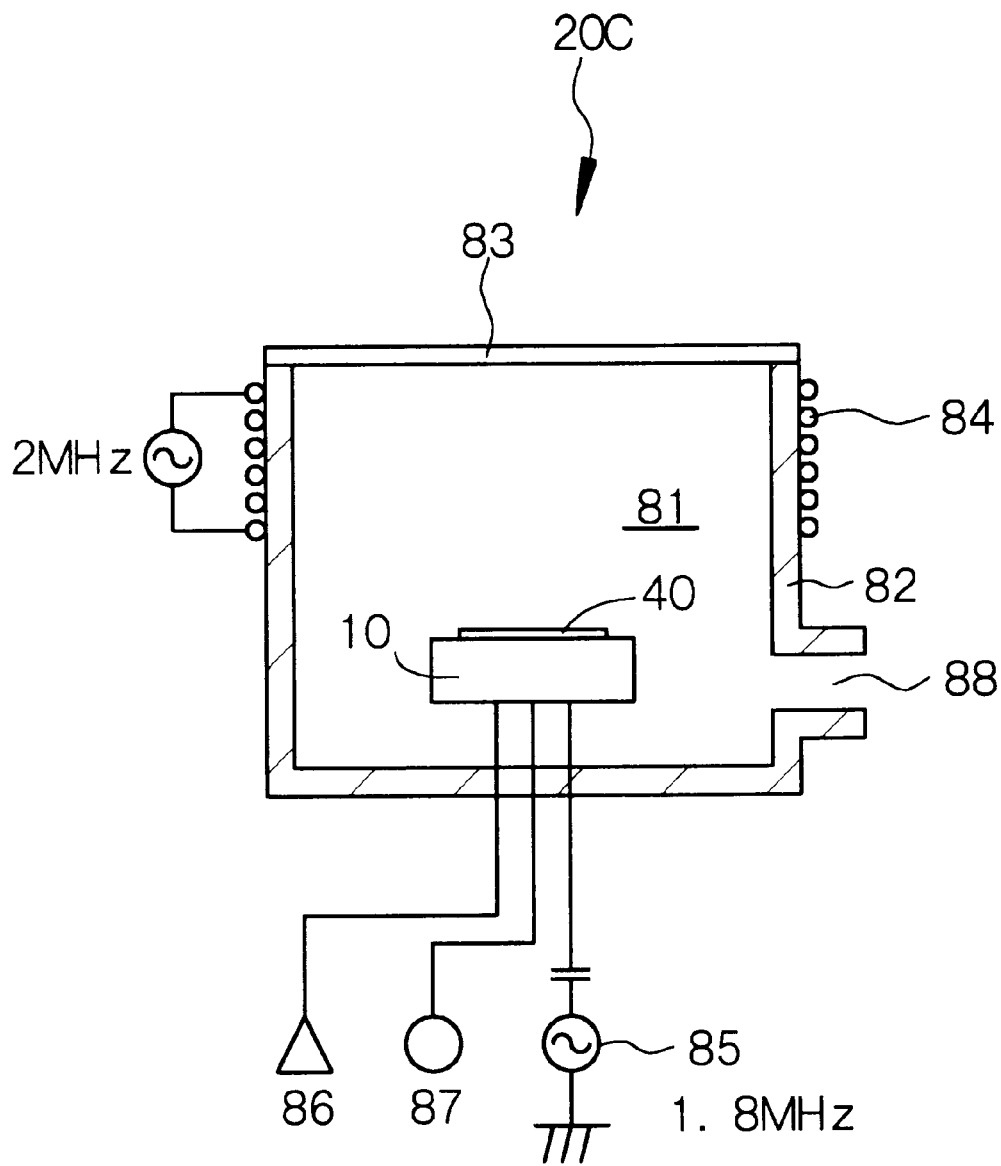
FIG. 9 is a conceptual view of an ICP type plasma etching apparatus.

The plasma etching apparatus may be, for example, an ICP type plasma etching apparatus as shown in FIG. 9. The etching apparatus 20C has a chamber 81 constituted of a chamber side wall 82 and a ceiling plate 83, and an induction coupled coil 84 disposed outside the chamber side wall 82. The chamber side wall 82 is made of quartz, and the ceiling plate 83 is formed of a composite material as will be described later. The glass substrate supporting stage 10 (see FIG. 1A) is disposed inside the chamber 81 for supporting and holding a glass substrate 40. Further, a discharge outlet 88 for discharging gas in the chamber 81 is connected to negative pressure means (not shown) such as a vacuum pump. A bias power source 85 for controlling incident ion energy on a base material is connected to the glass substrate supporting stage 10. Further, a DC power source 86 is connected to the electrode 14 (see FIG. 1A) for allowing the ceramic layer 13 to exhibit an electrostatic attracting force. The heater 15 disposed within the matrix 12 of the glass substrate supporting stage 10 is connected to a power source 87. The etching apparatus 20C has a fluorescence fiber thermometer (not shown) for measuring a glass substrate 40 for temperatures. The temperature of the glass substrate supporting stage 10 can be controlled by detecting a temperature sensed with the fluorescence fiber thermometer with a control device (PID controller) (not shown) and controlling the power source 87 which is for supplying power to the heater 15.

Figure 10A:
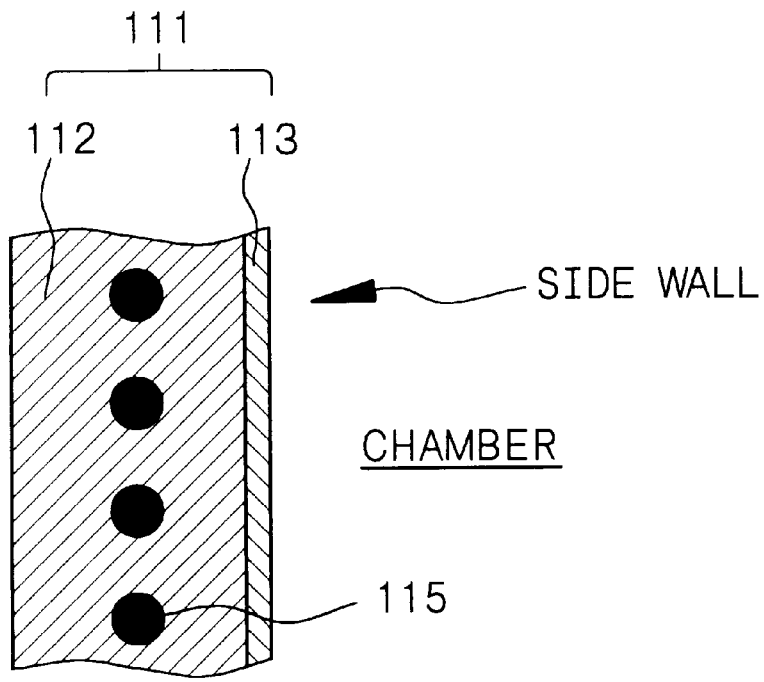
FIGS. 10A and 10B are schematic partial cross-sectional views of chamber side walls.

The chamber side wall and the ceiling plate of the glass substrate processing apparatus may be formed of a composite material as required. FIG. 10A shows a schematic partial cross-sectional view of the chamber side wall of the glass substrate processing apparatus. The chamber side wall comprises a composite material 111. The composite material 111 is formed of a matrix 112 and a ceramic layer 113 composed on a surface of the matrix 112 by a thermal spraying method. The matrix 112 is formed of a ceramic member and an aluminum-containing material. The aluminum-containing material is filled in a texture of the ceramic member.

A heater 115 which is a known sheathed heater is disposed within the chamber side wall (see FIG. 10A). The heater 115 comprises a heater element (not shown) and a sheath (not shown) disposed outside the heater element for protecting the heater element. The heater 115 is connected to a power source (not shown) through a wiring. The thermal expansion of the heater 115 influences the chamber side wall. Preferably, the heater 115 is therefore formed of a material having a linear thermal expansion coefficient value close to the linear thermal expansion coefficients $\alpha_1$ and $\alpha_2$ of the matrix 112 and the ceramic layer 113. Specifically, it is preferred to use a sheath formed of a material having a linear thermal expansion coefficient of $9 \times 10^{-6}/K$ to $12 \times 10^{-6}/K$, such as titanium or stainless steel. That is, preferably, the linear thermal expansion coefficient $\alpha_H$ [unit: $10^{-6}/K$] of the material constituting the heater 115 (the material for the sheath contacting the matrix 112) satisfies $(\alpha_1-4) \leq \alpha_H \leq (\alpha_1+4)$. Since a linear thermal expansion coefficient of the heater element has no influence on the chamber side wall, the material constituting the heater element is not critical. In some cases, a piping having the same structure as that of the already explained piping 16 may be disposed within the chamber side wall concurrently or together with the disposition of the heater 115, or the piping may be disposed within the chamber side wall in place of the heater 115.

Figure 10B:
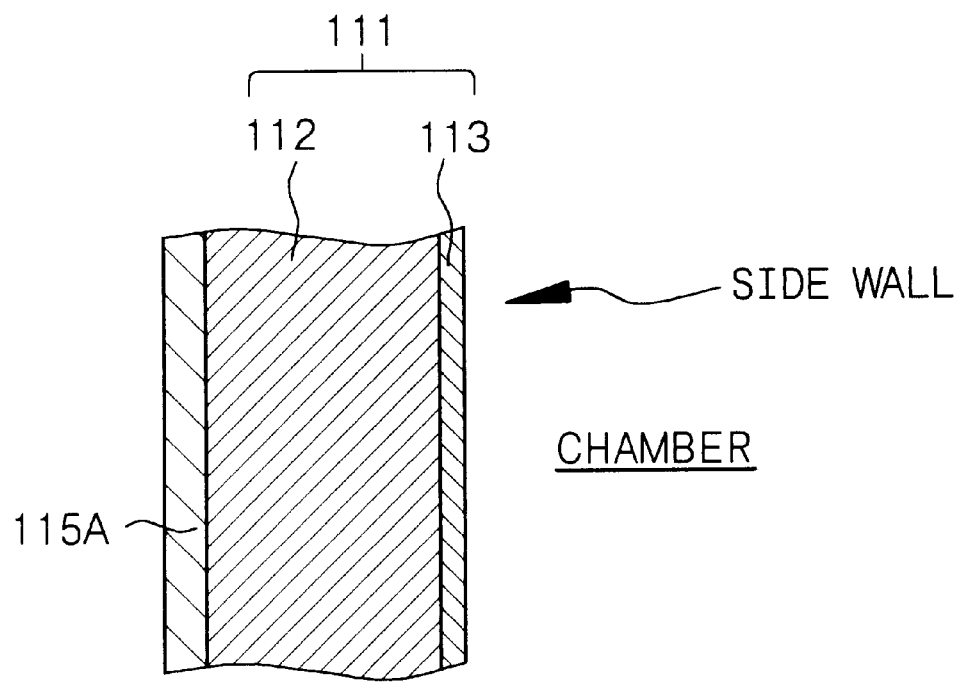

Otherwise, a heater 115A which is, for example, a PBN heater may be attached to an outer surface of the chamber side wall (surface opposite to the surface facing the chamber) as shown in a schematic cross-sectional view of FIG. 10B in place of embedding the heater 115 in the matrix 112.

Figure 11A:
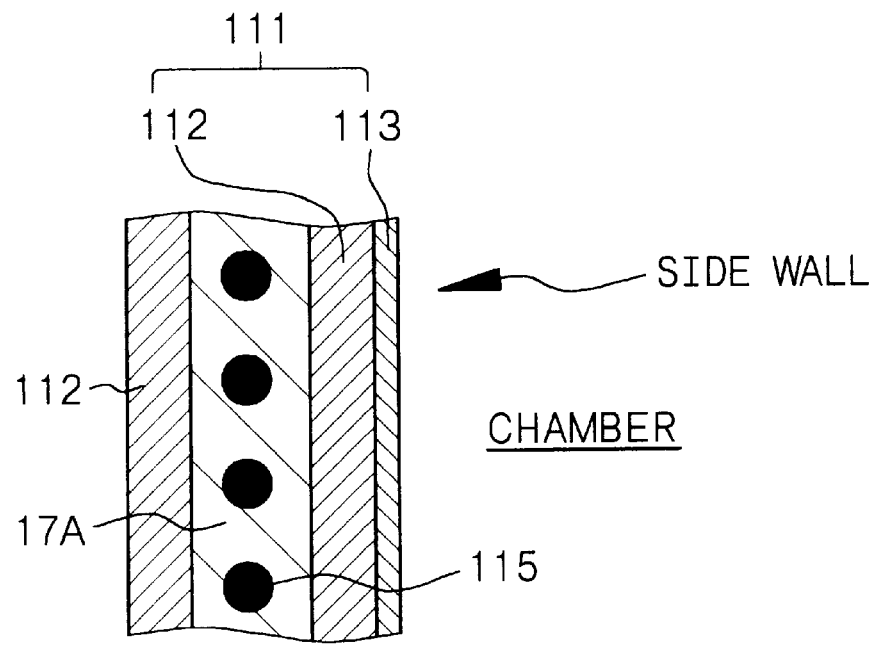
FIGS. 11A and 11B are schematic partial cross-sectional views of chamber side walls.
Figure 11B:
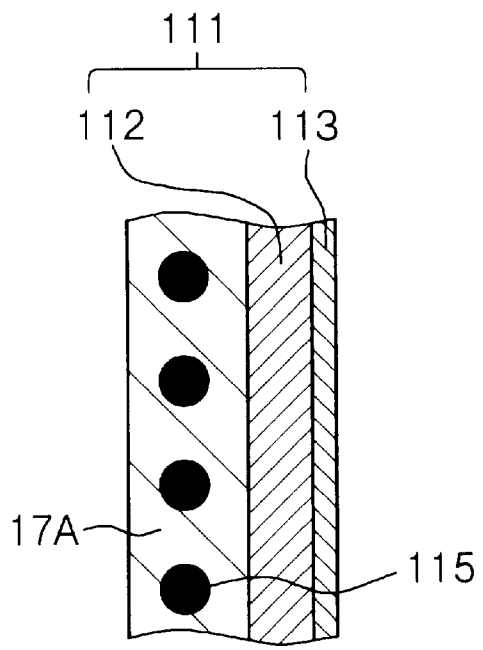
Figure 12:
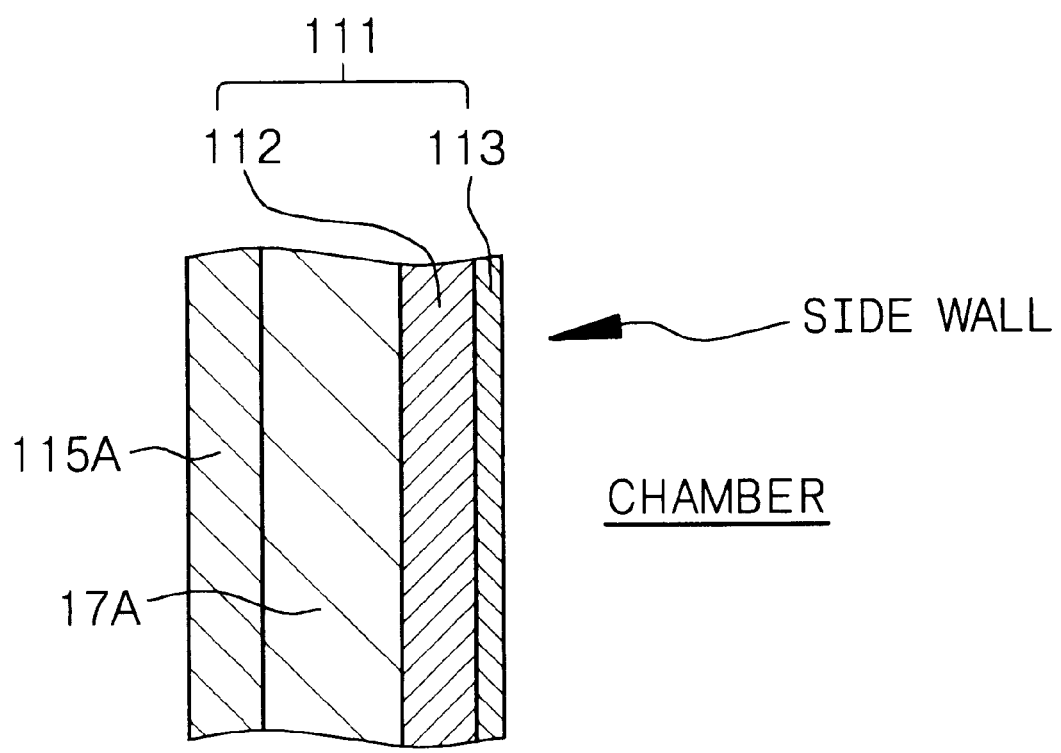
FIG. 12 is a schematic partial cross-sectional view of a chamber side wall.

FIGS. 11A, 11B and 12 show schematic cross-sectional views of chamber side walls of glass substrate processing apparatus, which chamber side walls are produced by fixing the composite material 111 to a hollow cylindrical member 17A made of stainless steel or aluminum by brazing or screwing. In FIG. 11A, a heater 115 (or a piping) is disposed within the hollow cylindrical member 17A. The composite material 111 is fixed to an inner surface of the hollow cylindrical member 17A and a matrix 112 is fixed to an outer surface thereof. The composite material 111 fixed to the inner surface (chamber side) of the hollow cylindrical member 17A has the same structure and the same constitution as those of the composite material explained in Examples. In FIG. 11B, a matrix on the outer surface of the hollow cylindrical member 17A is omitted. In FIG. 12, a PBN heater 115A is attached to the outer surface of the hollow cylindrical member 17A, and the composite material 111 is fixed to the inner surface of the hollow cylindrical member 17A.

A ceiling plate of the glass substrate processing apparatus can have the same structure as the composite material as required. The chamber side wall and the ceiling plate of these glass substrate processing apparatus can be produced substantially by the same methods as those in Examples 1 to 4 except for the formation of electrodes, and detailed explanations thereof are therefore omitted.

When plasma etching treatment is carried out on a base material using a glass substrate processing apparatus which is an etching apparatus, there are some cases using an etching apparatus having a parallel-flat-plate upper opposing electrode disposed therein.

Figure 13:
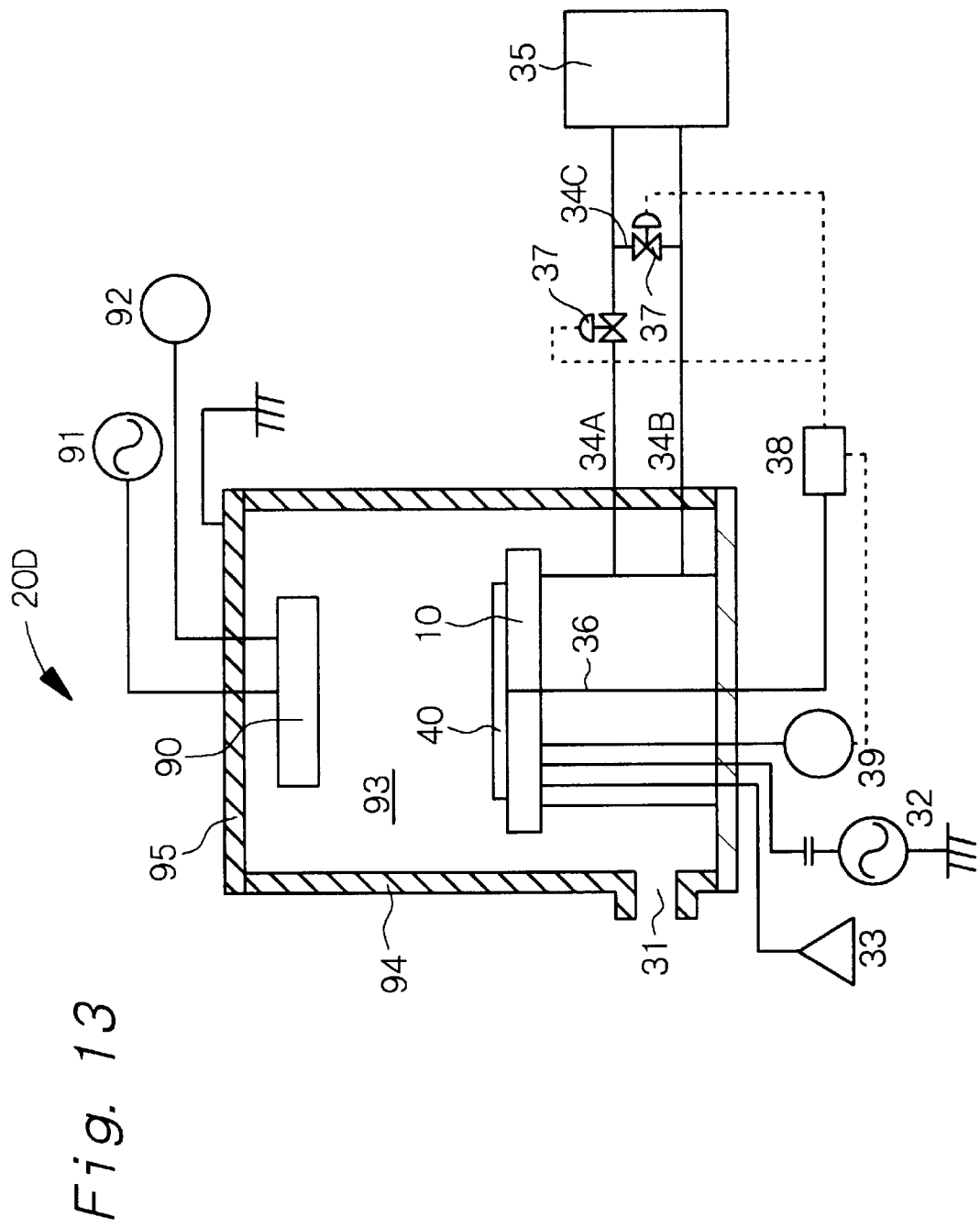
FIG. 13 is a conceptual view of a glass substrate processing apparatus having a parallel-flat-plate upper opposing electrode.
Figure 14A:
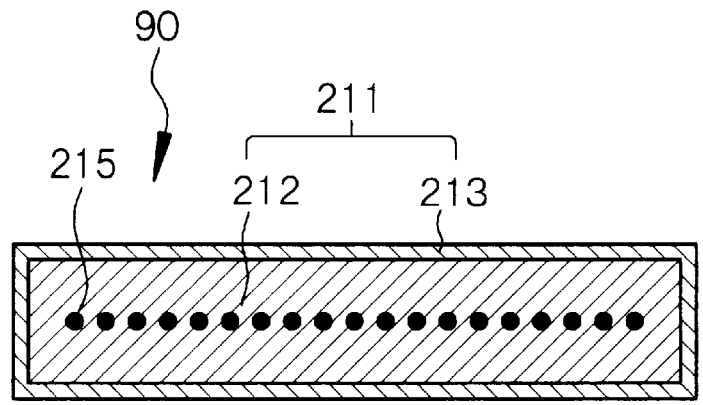
FIGS. 14A, 14B and 14C are schematic cross-sectional views of parallel-flat-plate upper opposing electrodes.

FIG. 13 shows a conceptual view of a glass substrate processing apparatus having a parallel-flat-plate upper opposing electrode 90 disposed therein (dry etching apparatus 20D, to be simply abbreviated as "etching apparatus 20D). FIG. 14A shows a schematic cross-sectional view of the upper opposing electrode.

In the above etching apparatus 20D, the parallel-flat-plate upper opposing electrode 90 is disposed in an upper portion of a chamber 93 so as to face a glass substrate supporting stage 10 which functions as a lower electrode. The upper opposing electrode 90 is connected to an RF power source 91. Preferably, a side wall 94 and a ceiling plate 95 of the chamber 93 comprises the composite material 111 explained with reference to FIGS. 10A, 10B, 11A, 11B and 12. In the etching apparatus 20D, elements and parts indicated by the same reference numerals as those in FIG. 2 are the same as those elements and parts in the etching apparatus shown in FIG. 2.

In the composite material for forming the upper opposing electrode 90, the ceramic member for forming a matrix 212 is composed of cordierite ceramic. The aluminum-containing material for forming the matrix is formed of aluminum (Al) and silicon (Si). The aluminum-containing material contains 20% by weight, based on the aluminum-containing material, of silicon. The matrix 212 has an electric conductivity value and a thermal conductivity value which are closer to those of a metal than to those of a pure ceramic. Therefore, high-frequency can be applied to the upper opposing electrode 90 formed of the above matrix 212 without any problem. A ceramic layer 213 is composed of a material prepared by adding approximately 2.5% by weight of $TiO_2$ to $Al_2O_3$. The ceramic layer 213 having a thickness of approximately 0.2 mm is formed on the surface of the matrix 212 by a thermal spraying method. The ceramic layer 213 having the above composition has a linear thermal expansion coefficient of approximately $9 \times 10^{-6}/K$ as an average value between 100° C. and 300° C. That is, $\alpha_2$ is approximately 9, and the linear thermal expansion coefficient $\alpha_2$ of the ceramic layer 213 satisfies $(\alpha_1 - 4) \leq \alpha_2 \leq (\alpha_1 + 4)$. $Al_2O_3$ itself has a linear thermal expansion coefficient of approximately $8 \times 10^{-6}/K$.

A heater 215 which is a known sheathed heater is disposed within the upper opposing electrode 90. The heater 215 comprises a heater element (not shown) and a sheath (not shown) disposed outside the heater element for protecting the heater element. The heater 215 is connected to a power source 92 (see FIG. 13) through a wiring (not shown). A thermal expansion of the heater 215 influences the upper opposing electrode 90.

Preferably, the heater 215 is therefore formed of a material having a linear thermal expansion coefficient value close to the linear thermal expansion coefficients of the ceramic layer 213 and the matrix 212.

Specifically, it is preferred to use a sheath formed of a material having a linear thermal expansion coefficient of $9 \times 10^6/K$ to $12 \times 10^{-6}K$, such as titanium or stainless steel. That is, preferably, the linear thermal expansion coefficient $\alpha_H$ [unit: $10^{-6}/K$] of the material constituting the heater 215 (the material for the sheath contacting the matrix 212) satisfies $(\alpha_1 - 4) \leq \alpha_H \leq (\alpha_1 + 4)$. Since a linear thermal expansion coefficient of the heater element has no influence on the upper opposing electrode 90, the material constituting the heater element is not critical.

The upper opposing electrode 90 comprising the composite material can be produced substantially by the same method as that explained in Example 1, and detailed explanations of the production method thereof are therefore omitted.

In the so-obtained upper opposing electrode 90, the matrix 212 is formed of a material obtained by filling an aluminum-containing material containing 80% by weight of Al and 20% by weight of Si in a porous cordierite ceramic fiber board, and the matrix 212 has a linear thermal expansion coefficient close to the linear thermal expansion coefficient of the ceramic layer 213. When the upper opposing electrode 90 is heated or cooled, therefore, the matrix 212 and the ceramic layer 213 are almost the same in expansion and shrinkage degrees. There can be therefore reliably prevented the occurrence of damage such as cracking of the ceramic layer 213, which damage is to be caused, due to a difference between the linear thermal expansion coefficients of the ceramic member 212 and the ceramic layer 213, at high temperatures or when the upper opposing electrode 90 is cooled to room temperature from high temperatures. Further, since the composite material 211 has excellent thermal conductivity, the heater 215 can effectively heat the upper opposing electrode 90.

In the etching treatment, there can be prevented the occurrence of damage such as cracking of the ceramic layers 213 and 113 of the upper opposing electrode 90, the side wall 94 and the ceiling plate 95. In a conventional etching apparatus, for example, a fluorocarbon polymer precursor formed during discharging is deposited on an upper opposing electrode and a chamber side wall, which causes the fluctuation of carbon/fluorine ratio of plasma during etching. Since, however, the upper opposing electrode 90, the side wall 94 and the ceiling plate 95 can be heated to high temperatures and maintained at the high temperatures, the deposition of the precursor on the upper opposing electrode, the chamber side wall and the ceiling plate can be effectively prevented, which results in the prevention of the fluctuation of carbon/fluorine ratio of plasma during etching, and highly accurate stabilized dry etching treatment can be carried out. Further, since almost no fluorocarbon polymer is deposited on the upper opposing electrode, the chamber side wall and the ceiling plate, the particle level is not downgraded even if the etching procedures are repeated many times.

The upper opposing electrode can be also produced by the method of producing the composite material explained in Examples 2 to 4.

Figure 14B:
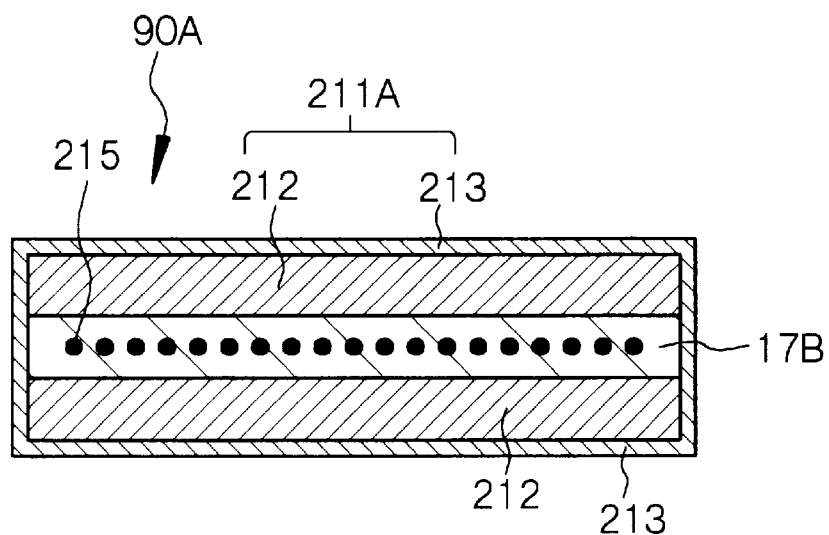
Figure 14C:
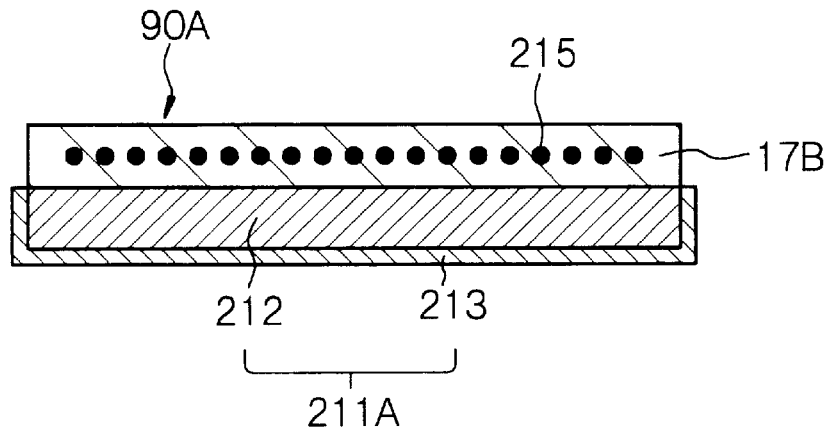

FIGS. 14B and 14C show schematic cross-sectional views of an upper opposing electrode 90A produced by fixing a composite material 211A to a disc-shaped member 17B made of stainless steel or aluminum by brazing or screwing. A heater 215 is disposed within the disc-shaped member 17B. The composite material 211A has the same structure as that of the composite material 211. In FIG. 14B, a composite material 211A is fixed to the upper surface of the disc-shaped member 17B and a composite material 211A is fixed to the lower surface thereof. In FIG. 14C, the composite material on the upper surface of the disc-shaped member 17B is omitted.

In the glass substrate processing apparatus of the present invention, part thereof, for example, the glass substrate supporting stage, comprises the composite material. Therefore, the occurrence of damage of the ceramic layer caused by thermal expansion of the matrix and the ceramic layer can be prevented, and the composite material can be reliably used at high temperatures. Further, the ceramic layer is formed on the surface of the matrix by a thermal spraying method. Therefore, the composite material having a large area can be easily produced, and the processing of a glass substrate having a large area can be accomplished. Furthermore, the matrix and the ceramic layer are integrated to a far higher degree. Therefore, not only can stress between the matrix and the ceramic layer be eased, but also the heat conduction from the matrix to the ceramic layer is promoted, so that the temperature of a glass substrate held and supported on the ceramic layer can be more smoothly and reliably controlled. Therefore, a glass substrate having a large area can be processed, and moreover, processing of a base material at a high temperature can be highly accurately carried out.

What is claimed is:

1. A glass substrate processing apparatus having a first part which comprises:

a composite material, comprising a matrix and a ceramic layer formed on a surface of the matrix by a thermal spraying method, wherein said matrix comprises a ceramic member and an aluminum-containing material filled in a texture of the ceramic member.

2. The apparatus of claim 1, wherein said apparatus is for carrying out etching treatment, CVD treatment or sputtering on a base material formed on a glass substrate, and in which said first part of said apparatus is a glass substrate supporting stage comprising an electrostatic chuck functioning portion, and temperature control means.

3. The apparatus of claim 2, wherein the glass substrate supporting stage is used as an electrode and the ceramic layer comprises said electrostatic chuck functioning portion.

4. The apparatus of claim 2, wherein said ceramic layer comprises an electrode formed therein and said electrostatic chuck functioning portion.

5. The apparatus of claim 2, wherein the temperature control means is a heater.

6. The apparatus of claim 5, wherein the heater is disposed within the matrix and has a linear thermal expansion coefficient $\alpha_H$ (unit: $10^{-6}/K$) which satisfies $(\alpha_1 - 4) \leq \alpha_H \leq (\alpha_1 + 4)$ in which $\alpha_1$ (unit: $10^{-6}/K$) is a linear thermal expansion coefficient of the matrix.

7. The apparatus of claim 5, wherein the temperature control means is a piping disposed within the matrix for flowing a temperature-controlling heating medium therein and has a linear thermal expansion coeffiecient $\alpha_P$ (unit: $10^{-6}/K$) which satifies $(\alpha_1 - 4) \leq \alpha_P \leq (\alpha_1 + 4)$ in which $\alpha_1$ (unit: $10^{-6}/K$) is a linear thermal expansion coefficient of the matrix.

8. The apparatus of claim 1, wherein the ceramic layer has a linear thermal expansion coefficient $\alpha_2$ (unit: $10^{-6}/K$) which satifies $(\alpha_1 - 4) \leq \alpha_2 \leq (\alpha_1 + 4)$ in which $\alpha_1$ (unit: $10^{-6}/K$) is a linear thermal expansion coefficient of the matrix.

9. The apparatus of claim 8, wherein the ceramic member forming the matrix is composed of cordierite ceramic, the aluminum-containing material forming the matrix is composed of aluminum and silicon, and the ceramic layer is composed of $Al_2O_3$.

10. The apparatus of claim 8, wherein the ceramic member forming the matrix is composed of aluminum nitride, the aluminum-containing material forming the matrix is composed of aluminum or aluminum and silicon, and the ceramic layer is composed of $Al_2O_3$.

11. The apparatus of claim 8, wherein the ceramic member forming the matrix is composed of silicon carbide, the aluminum-containing material forming the matrix is composed of aluminum or aluminum and silicon, and the ceramic layer is composed of $Al_2O_3$.

12. The apparatus of claim 8, wherein the ceramic member forming the matrix is composed of aluminum oxide, the aluminum-containing material forming the matrix is composed of aluminum or aluminum and silicon, and the ceramic layer is composed of $Al_2O_3$.

* * * * *